(12) United States Patent
Bu et al.

(10) Patent No.: US 10,229,983 B1
(45) Date of Patent: *Mar. 12, 2019

(54) METHODS AND STRUCTURES FOR FORMING FIELD-EFFECT TRANSISTORS (FETS) WITH LOW-K SPACERS

(71) Applicant: International Business Machines Corporation, Armonk, NY (US)

(72) Inventors: Huiming Bu, Glenmont, NY (US); Kangguo Cheng, Schenectady, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/815,019

(22) Filed: Nov. 16, 2017

(51) Int. Cl.
*H01L 29/66* (2006.01)
*H01L 29/51* (2006.01)
*H01L 21/8234* (2006.01)
*H01L 27/088* (2006.01)

(52) U.S. Cl.
CPC ............ *H01L 29/66545* (2013.01); *H01L 21/823418* (2013.01); *H01L 21/823462* (2013.01); *H01L 27/088* (2013.01); *H01L 29/513* (2013.01); *H01L 29/6653* (2013.01); *H01L 29/6656* (2013.01)

(58) Field of Classification Search
None
See application file for complete search history.

(56) References Cited

U.S. PATENT DOCUMENTS

| | | | |
|---|---|---|---|
| 6,300,201 B1 | 10/2001 | Shao et al. | |
| 6,353,249 B1 * | 3/2002 | Boyd | H01L 21/28114 257/327 |
| 6,613,621 B2 | 9/2003 | Uh et al. | |
| 7,435,636 B1 * | 10/2008 | Hanafi | H01L 29/105 257/E21.441 |
| 7,812,370 B2 | 10/2010 | Bhuwalka et al. | |
| 9,142,649 B2 | 9/2015 | Liu et al. | |
| 9,159,567 B1 | 10/2015 | Xiao et al. | |
| 9,230,962 B2 | 1/2016 | Tsai et al. | |
| 9,240,461 B2 | 1/2016 | Kim et al. | |
| 9,275,960 B2 | 3/2016 | Yao et al. | |
| 2004/0132236 A1 * | 7/2004 | Doris | H01L 21/28114 438/182 |
| 2008/0237663 A1 | 10/2008 | Hanafi | |
| 2013/0049142 A1 * | 2/2013 | Liu | H01L 29/4983 257/412 |

(Continued)

*Primary Examiner* — Karen Kusumakar
(74) *Attorney, Agent, or Firm* — Vazken Alexanian; Ryan, Mason & Lewis, LLP

(57) ABSTRACT

A method for manufacturing a semiconductor device includes forming a plurality of dummy gate patterns spaced apart from each other on a substrate, growing a plurality of source/drain regions adjacent the plurality of dummy gate patterns, forming a dielectric layer on each of the plurality of source/drain regions adjacent the plurality of dummy gate patterns, removing the plurality of dummy gate patterns to create a plurality of trenches, forming a plurality of spacers on sidewalls of each of the plurality of trenches, wherein the plurality of spacers comprise at least one of a low-k material and an airgap, and forming a gate structure in each of the plurality of trenches between the plurality of spacers.

19 Claims, 19 Drawing Sheets

(56) References Cited

U.S. PATENT DOCUMENTS

| | | | |
|---|---|---|---|
| 2014/0159142 A1* | 6/2014 | Lim | H01L 29/7834 |
| | | | 257/330 |
| 2015/0243760 A1 | 8/2015 | He et al. | |
| 2015/0255571 A1 | 9/2015 | Xu et al. | |
| 2015/0364578 A1 | 12/2015 | Liu et al. | |
| 2016/0111515 A1 | 4/2016 | Besser et al. | |
| 2016/0284820 A1 | 9/2016 | Basker et al. | |

* cited by examiner

100

100

100

100

200

200

400

400

400

400

US 10,229,983 B1

METHODS AND STRUCTURES FOR FORMING FIELD-EFFECT TRANSISTORS (FETS) WITH LOW-K SPACERS

TECHNICAL FIELD

The field generally relates to semiconductor devices and methods of manufacturing same and, in particular, to techniques to form transistors that include low-k gate spacers and/or gate spacers having airgaps.

BACKGROUND

Semiconductor devices, such as, for example, complementary metal-oxide semiconductor (CMOS) devices are continuously being scaled down to smaller dimensions. As components are scaled down and transistors are being formed closer together, dielectrics, such as gate spacers, formed between conducting elements can cause charge build up and crosstalk, which can adversely affect device performance. Low-k dielectric materials have a small dielectric constant relative to that of silicon dioxide. Low-k dielectrics having the same thickness as dielectrics with dielectric constants greater than or equal to that of silicon dioxide can reduce parasitic capacitance and provide low contact resistance, resulting in improved device performance at smaller scales.

Due to conventional methods for forming field-effect transistors (FETs), spacer material must be able to withstand aggressive epitaxial pre-cleaning processes, etching processes, and high temperature processes, such as epitaxial growth. As a result, the universe of available low-k dielectrics that can tolerate current processing flows is limited.

SUMMARY

According to an exemplary embodiment of the present invention, a method for manufacturing a semiconductor device includes forming a sacrificial dielectric layer on a substrate, forming a plurality of dummy gate patterns spaced apart from each other on the sacrificial dielectric layer, removing exposed portions of the sacrificial dielectric layer adjacent the plurality of dummy gate patterns, growing a plurality of source/drain regions adjacent the plurality of dummy gate patterns, forming a dielectric layer on each of the plurality of source/drain regions adjacent the plurality of dummy gate patterns, removing the plurality of dummy gate patterns to create a plurality of trenches, forming a plurality of spacers on sidewalls of each of the plurality of trenches, wherein the plurality of spacers comprise at least one of a low-k material and an airgap, and forming a gate structure in each of the plurality of trenches between the plurality of spacers.

According to an exemplary embodiment of the present invention, a semiconductor device includes a plurality of gate structures spaced apart from each other on a substrate, a plurality of source/drain regions adjacent the plurality of gate structures, a plurality of spacers on sidewalls of each of the plurality of gate structures, wherein the plurality of spacers comprise at least one of a low-k material and an airgap, and a gate dielectric layer formed between each of the plurality of spacers and a corresponding gate structure, wherein the gate dielectric layer is further formed in an undercut region under each of the plurality of spacers, and on the substrate between the substrate and the corresponding gate structure.

According to an exemplary embodiment of the present invention, a method for manufacturing a semiconductor device includes forming a plurality of dummy gate patterns spaced apart from each other on a substrate, growing a plurality of source/drain regions adjacent the plurality of dummy gate patterns, forming a dielectric layer on each of the plurality of source/drain regions adjacent the plurality of dummy gate patterns, removing the plurality of dummy gate patterns to create a plurality of trenches, forming a plurality of spacers on sidewalls of each of the plurality of trenches, wherein the plurality of spacers comprise at least one of a low-k material and an airgap, and forming a gate structure in each of the plurality of trenches between the plurality of spacers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
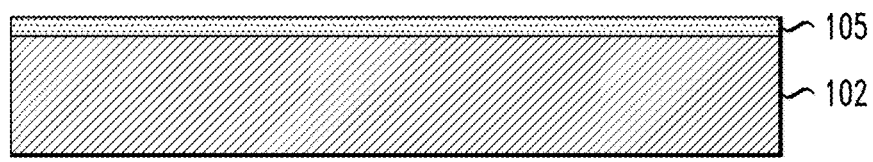
FIG. 1 is a cross-sectional view illustrating formation of a sacrificial dielectric layer on a semiconductor substrate in a method of manufacturing a semiconductor device, according to an exemplary embodiment of the present invention.

Exemplary embodiments of the invention will now be discussed in further detail with regard to semiconductor devices and methods of manufacturing same and, in particular, to the formation of low-k gate spacers, which may include gate spacers having airgaps within the spacer structure.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET CMOS and/or, MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

Illustrative embodiments of the present invention provide methods and structures for forming transistors with low-k spacers, including spacers having airgaps within the spacer structure, understanding that the dielectric constant of air (1.00059 at 1 atm) is close to the dielectric constant of a vacuum, which is 1.

In accordance with embodiments of the present invention, low-k spacers are formed after epitaxial growth of source/drain regions. According to embodiments of the present invention, the spacers can be formed after co-polymer deposition, annealing and stripping in dummy gate trenches, and followed by further polymer stripping and deposition of gate structures. The spacers can also be formed after deposition and removal of dummy spacers, and dielectrics in gate regions and followed by deposition of gate structures.

FIG. 1 is a cross-sectional view illustrating formation of a sacrificial dielectric layer on a semiconductor substrate in a method of manufacturing a semiconductor device, according to an exemplary embodiment of the present invention. Referring to FIG. 1, a semiconductor substrate 102 of a device 100 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate. The semiconductor substrate 102 can be a bulk substrate or a silicon-on-insulator (SOI) substrate including a buried insulating layer, such as, for example, a buried oxide or nitride layer. The semiconductor substrate 102 includes a plurality of active (e.g., channel) regions where gates will be formed, which are defined by isolation regions (not shown), such as, for example shallow trench isolation (STI) regions. Although shown as a planar structure, the substrate 102 may comprise non-planar structures such as fins, nanowires, nanosheets, etc.

A sacrificial dielectric layer 105, including, for example, a dielectric material, such as, but not necessarily limited to, silicon dioxide ($SiO_2$), silicon oxynitride or other dielectric is formed on the semiconductor substrate 102 using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In a non-limiting illustrative example, the thickness of the layer 105 can be in the range of about 2 nm to about 6 nm.

Figure 2:
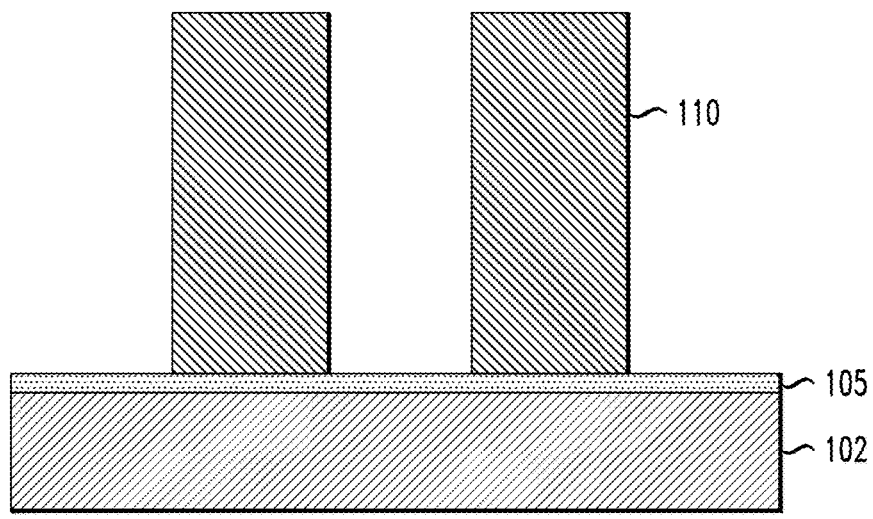
FIG. 2 is a cross-sectional view illustrating formation of dummy gate patterns in a method of manufacturing a semiconductor device, according to an exemplary embodiment of the present invention.

FIG. 2 is a cross-sectional view illustrating formation of dummy gate patterns in a method of manufacturing a semiconductor device, according to an exemplary embodiment of the present invention. Referring to FIG. 2, dummy gate patterns 110, comprising, for example silicon nitride (SiN), or amorphous carbon, are formed on the sacrificial dielectric layer 105 over the active regions. The dummy gate may comprise a single layer or multiple layers (e.g., amorphous carbon with a SiN cap). The dummy gate patterns 110 are formed by depositing the dummy gate material(s) on the sacrificial dielectric layer 105 using, for example, deposition techniques including, but not limited to, CVD, PECVD, RFCVD, PVD, ALD, MLD, MBD, PLD, LSMCD, and/or sputtering, and then patterning the deposited layer into the dummy gate patterns 110. The patterning can be performed using, for example, lithography and etching (e.g., reactive ion etch (RIE). Other patterning techniques such as sidewall image transfer (SIT) can be used.

In accordance with an embodiment of the present invention, a lateral width of each dummy gate pattern 110 includes at least the desired final gate length plus twice the final lateral spacer thickness. Accordingly, the width of a dummy gate pattern 110 encompasses at least the width of the final gate structure and spacers on either side of the final gate structure. In a non-limiting illustrative example, the width of a dummy gate pattern 110 can be in the range of about 20 nm to about 50 nm.

Figure 3:
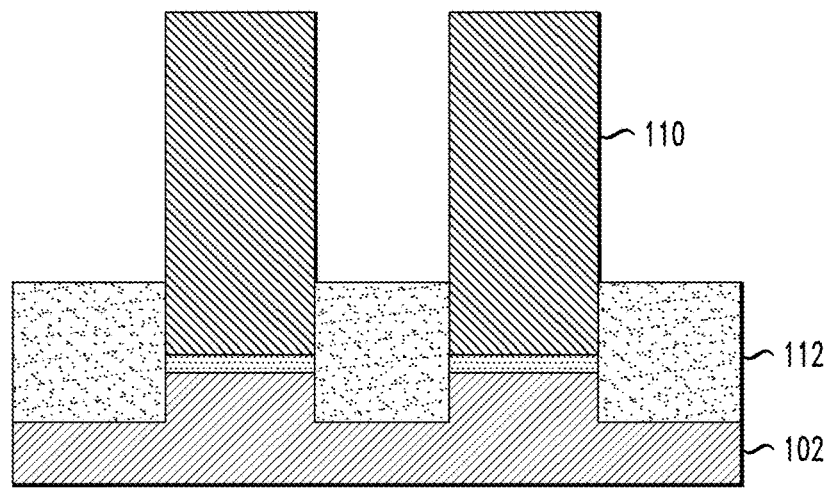
FIG. 3 is a cross-sectional view illustrating formation of source/drain regions in a method of manufacturing a semiconductor device, according to an exemplary embodiment of the present invention.

FIG. 3 is a cross-sectional view illustrating formation of source/drain regions in a method of manufacturing a semiconductor device, according to an exemplary embodiment of the present invention. Referring to FIG. 3, exposed portions of the substrate 102 in what is to become source/drain regions of a resulting device are recessed using, for example, an etching process, such as reactive ion etching (RIE). In addition, exposed portions of the sacrificial dielectric layer 105 adjacent the dummy gate patterns 110 are removed, using an etching process such as, but not necessarily limited to, RIE.

In some embodiments, after recessing of the portions of the substrate 102, and removal of the portions of the layer 105, source/drain regions 112 are formed by epitaxial growth on the recessed portions of the substrate 102 adjacent the dummy gate patterns 110. Source/drain regions 112 including, for example, epitaxially grown silicon (Si), silicon germanium (SiGe) or other semiconductor material, are formed by selective epitaxy on the substrate 102 between the dummy gate patterns 110. The source/drain regions 112 can be doped by, for example, ion implantation, in situ doping during epitaxy, plasma doping, solid phase doping, gas phase doping, or other doping processes, or any suitable combination of those doping techniques. In some embodiments, the source/drain regions are formed without recessing the substrate (in other words, the recessing step is optional).

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

By "in-situ", it is meant that the dopant that dictates the conductivity type of the doped layer is introduced during the process step, e.g., epitaxial deposition, that forms the doped layer. The term "selective epitaxy" means that the deposition process occurs over a semiconductor surface such as substrate 102, but no material is deposited over dielectric surfaces such as dummy gate patterns 110.

Figure 4:
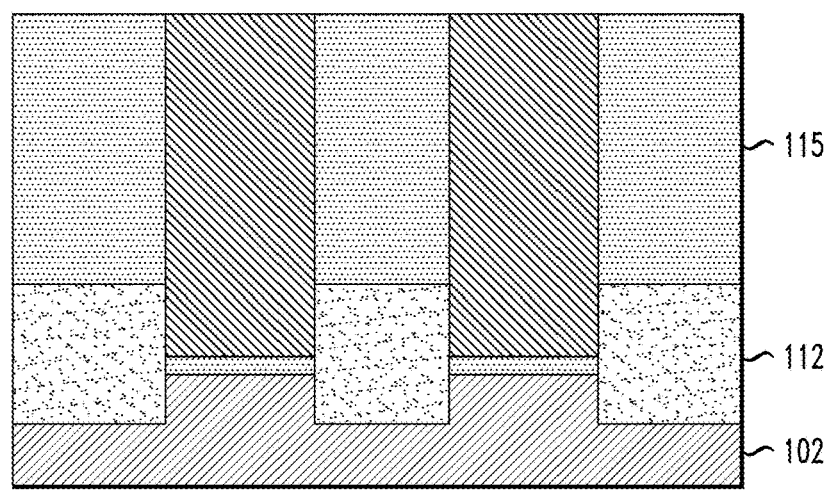
FIG. 4 is a cross-sectional view illustrating dielectric layer deposition in source/drain regions and planarization in a method of manufacturing a semiconductor device, according to an exemplary embodiment of the present invention.

FIG. 4 is a cross-sectional view illustrating dielectric layer deposition in source/drain regions and planarization in a method of manufacturing a semiconductor device, according to an exemplary embodiment of the present invention. Referring to FIG. 4, dielectric layers 115, such as, for example, an oxide or other dielectric material, such as, fluorine doped silicon oxide, or carbon doped oxide, are deposited on the source/drain regions 112 between the dummy gate patterns 110. In some embodiments, the dielectric layers 115 comprise multiple materials. The dielectric layers 115 can be deposited using deposition techniques, including, but not limited to, CVD, PECVD, RFCVD, PVD, ALD, MLD, MBD, PLD, LSMCD, spin-on, and/or sputtering. Chemical mechanical polishing (CMP) is used to planarize the structure and remove the excess dielectric layer 115 that may have been deposited on a top surface of the dummy gate patterns 110. In accordance with an embodiment of the present invention, the CMP can be used to remove the excess dielectric layer 115 down to the top surface of the dummy gate patterns 110.

Figure 5:
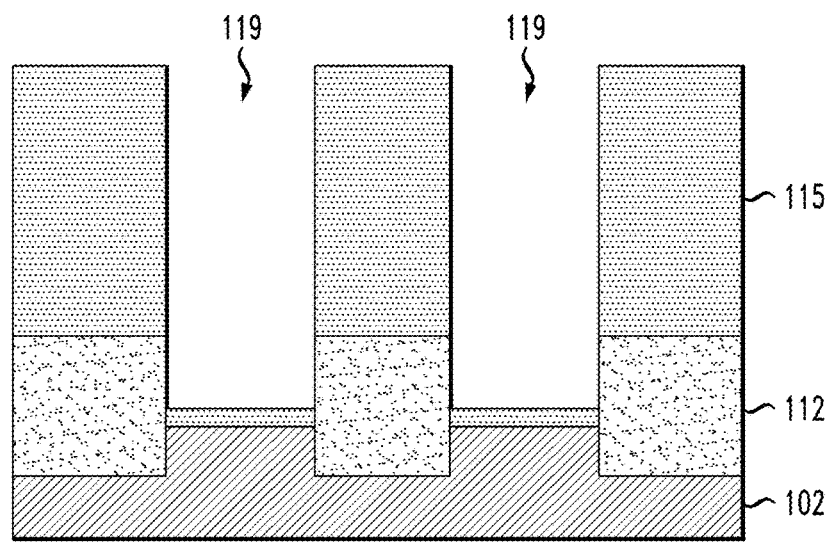
FIG. 5 is a cross-sectional view illustrating removal of dummy gate patterns in a method of manufacturing a semiconductor device, according to an exemplary embodiment of the present invention.

FIG. 5 is a cross-sectional view illustrating removal of dummy gate patterns in a method of manufacturing a semiconductor device, according to an exemplary embodiment of the present invention. Referring to FIG. 5, the dummy gate patterns 110 are selectively removed with respect to the material of the dielectric layers 115 and 105. For example, in accordance with a non-limiting illustrative embodiment of the present invention, the dummy gate patterns 110 comprising SiN are selectively removed with respect to an oxide, such as $SiO_2$, which can be the material of the layers 115 and 105. Other material combinations for the dummy gate patterns 110 and layers 115 and 105 may be used such that the dummy gate patterns 110 can be selectively removed with respect to layers 115 and 105. The selective removal can be performed using an etching process utilizing, for example, an aqueous solution containing phosphoric acid.

Figure 6:
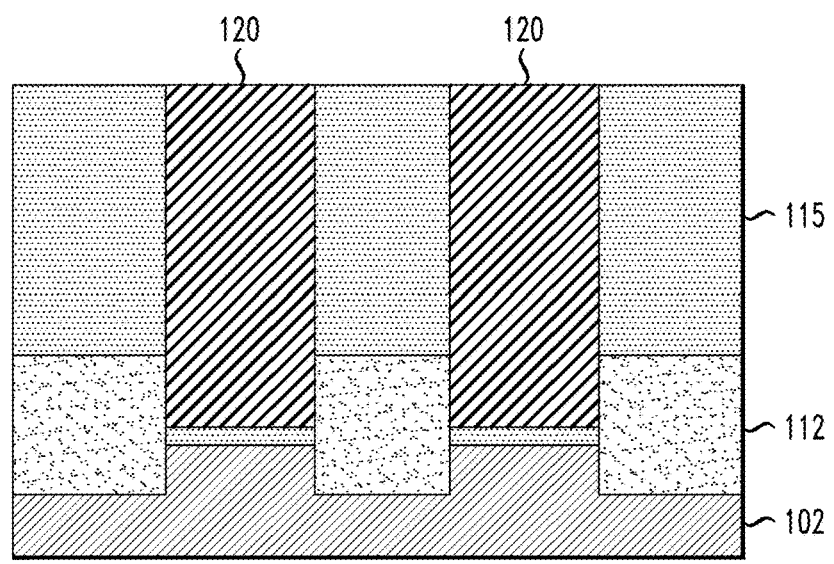
FIG. 6 is a cross-sectional view illustrating directed self-assembly (DSA) co-polymer fill in a method of manufacturing a semiconductor device, according to an exemplary embodiment of the present invention.

FIG. 6 is a cross-sectional view illustrating directed self-assembly (DSA) co-polymer fill in a method of manufacturing a semiconductor device, according to an exemplary embodiment of the present invention. Referring to FIG. 6, a co-polymer 120 is deposited on sacrificial dielectric layer 105 between the dielectric layers 115 in the spaces left by removal of the dummy gate patterns 110. The deposition of the DSA co-polymer can be performed using, for example, spin-coating. In accordance with an embodiment of the present invention, the co-polymer comprises two polymers, such as, but not necessarily limited to, PS-PMMA (polystyrene (PS) and poly (methyl methacrylate) (PMMA)). Other materials for the co-polymer can include, for example, polystyrene-block-poly (methyl methacrylate) (PS-b-PMMA), polystyrene-block-polydimethylsiloxane (PS-b-PDMS), poly (styrene-b-vinylpyridine) (PS-b-PVP), and poly (styrene-block-poly (lactic acid) (PS-b-PLA), polystyrene-b-polyisoprene (PS-b-PI), and the like.

Figure 7:
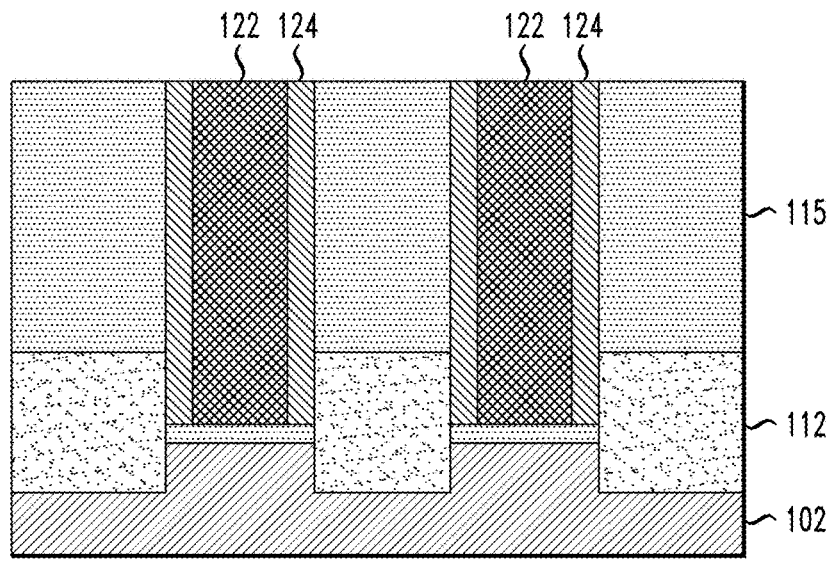
FIG. 7 is a cross-sectional view illustrating DSA co-polymer annealing to form multiple polymer layers in a method of manufacturing a semiconductor device, according to an exemplary embodiment of the present invention.

FIG. 7 is a cross-sectional view illustrating DSA co-polymer annealing to form multiple polymer layers in a method of manufacturing a semiconductor device, according to an exemplary embodiment of the present invention. Referring to FIG. 7, the DSA co-polymer 120 is annealed at a temperature of, for example, 140° C. for 1 minute, which causes the co-polymer 120 to transform into three polymer layers in each active region trench 119. Each combination of the three polymer layers includes two side polymer layers 124 and a middle polymer layer 122 between the side polymer layers 124. In accordance with a non-limiting illustrative embodiment of the present invention, the side polymer layers 124 comprise PS, and the middle polymer layer 122 comprises PMMA.

Figure 8:
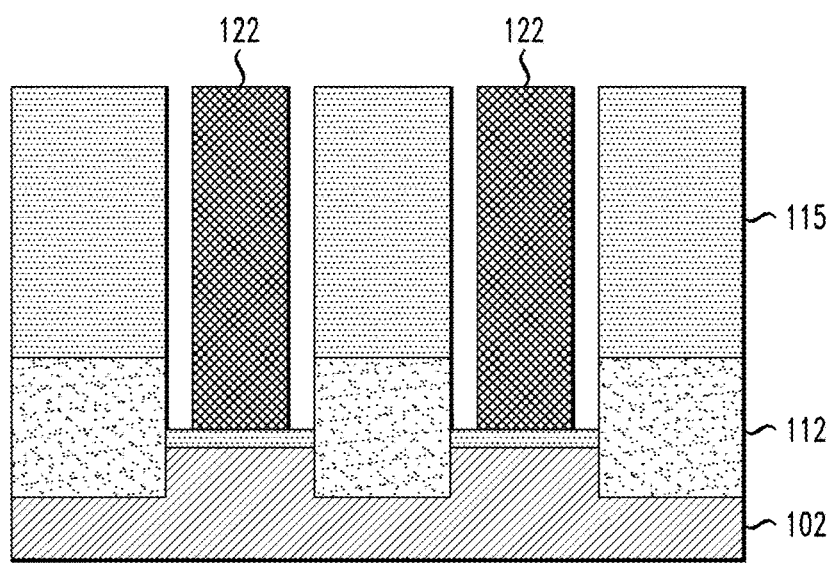
FIG. 8 is a cross-sectional view illustrating stripping of first polymer layers in a method of manufacturing a semiconductor device, according to an exemplary embodiment of the present invention.

FIG. 8 is a cross-sectional view illustrating stripping of first polymer layers in a method of manufacturing a semiconductor device, according to an exemplary embodiment of the present invention. Referring to FIG. 8, the two side polymer layers 124 are removed from the trenches 119 leaving gaps on opposite sides of the middle polymer layers 122. A stripping process, such as, but not necessarily limited to, a dry or wet etch process, is used to selectively remove the two side polymer layers 124 with respect to the middle polymer layers 122. In some embodiments, the co-polymer comprises poly (methyl methacrylate) (PMMA) and polystyrene (PS). PMMA can be removed selective to PS by using a gas plasma containing $O_2$ and $C_4F_8$.

Figure 9:
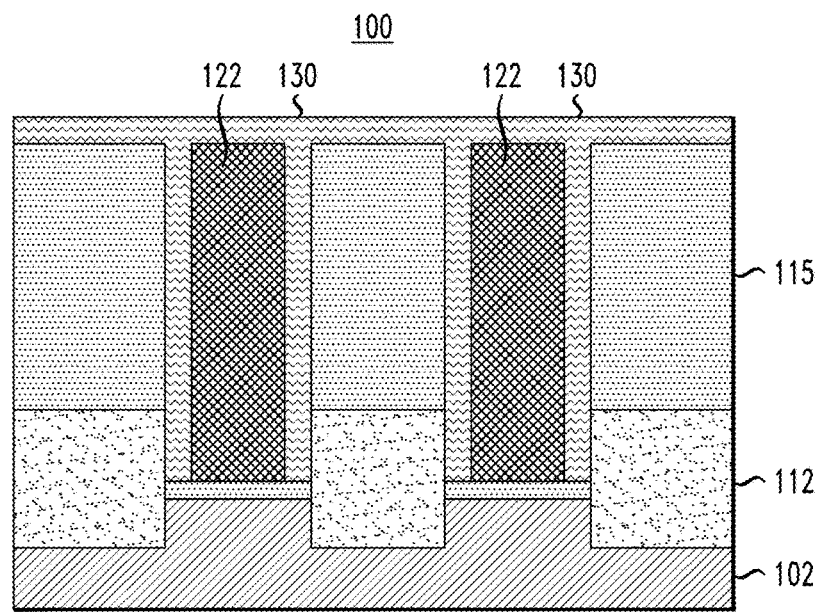
FIG. 9 is a cross-sectional view illustrating low-k spacer deposition in a method of manufacturing a semiconductor device, according to an exemplary embodiment of the present invention.

FIG. 9 is a cross-sectional view illustrating low-k spacer deposition in a method of manufacturing a semiconductor device, according to an exemplary embodiment of the present invention. Referring to FIG. 9, a low-k spacer material 130, such as, for example, SiOCN, SiBCN, SiCN, SiOC, SiON, or any suitable combination of those materials, is deposited to fill in the gaps on the opposite sides of the middle polymer layers 122 left by the removal of the two side polymer layers 124. The spacer material 130 is also deposited on upper surfaces of the dielectric and middle polymer layers 115, 122. The spacer material 130 can be deposited using deposition techniques, including, but not limited to, CVD, PECVD, RFCVD, PVD, ALD, MLD, MBD, PLD, LSMCD, and/or sputtering.

Figure 10:
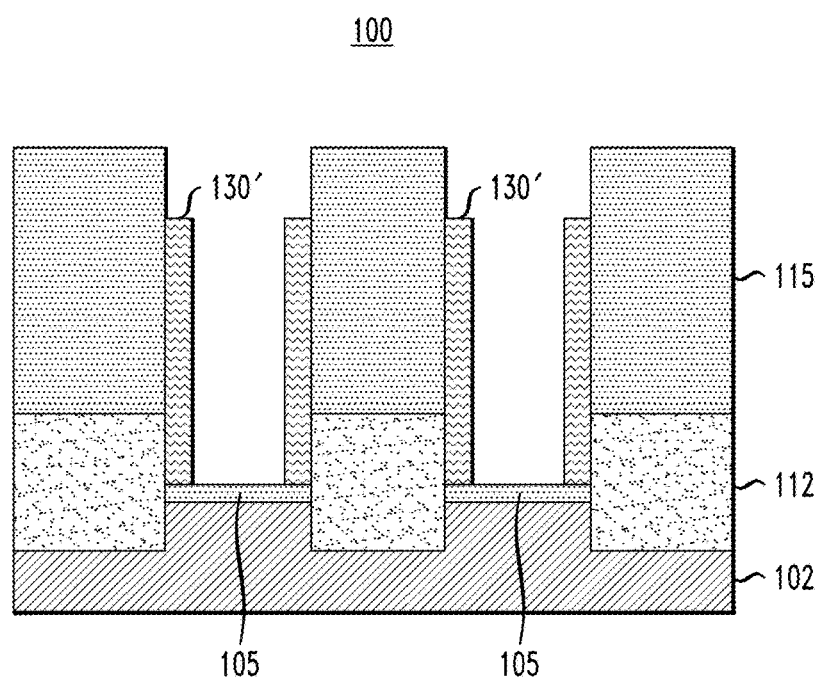
FIG. 10 is a cross-sectional view illustrating removing the low-k spacer material from the top of the structure, stripping of second polymer layers and spacer pull-down in a method of manufacturing a semiconductor device, according to an exemplary embodiment of the present invention.

FIG. 10 is a cross-sectional view illustrating removing the low-k spacer material from the top of the structure, stripping of second polymer layers and spacer pull-down in a method of manufacturing a semiconductor device, according to an exemplary embodiment of the present invention. Referring to FIG. 10, an etch process (e.g., ME) is performed to remove the low-k spacer material from horizontal upper surfaces of the dielectric layer 115 and middle polymer layers 122. The middle polymer layers 122 are removed from the trenches 119. A stripping process, such as, but not necessarily limited to, ashing, is used to selectively remove the middle polymer layers 122. In addition, a directional etch using, example, ME, is performed to pull down the spacer material to a lower height within the trenches 119 form spacers 130'. The removed middle polymer layers 122 result in respective gaps between the spacers 130'.

Figure 11:
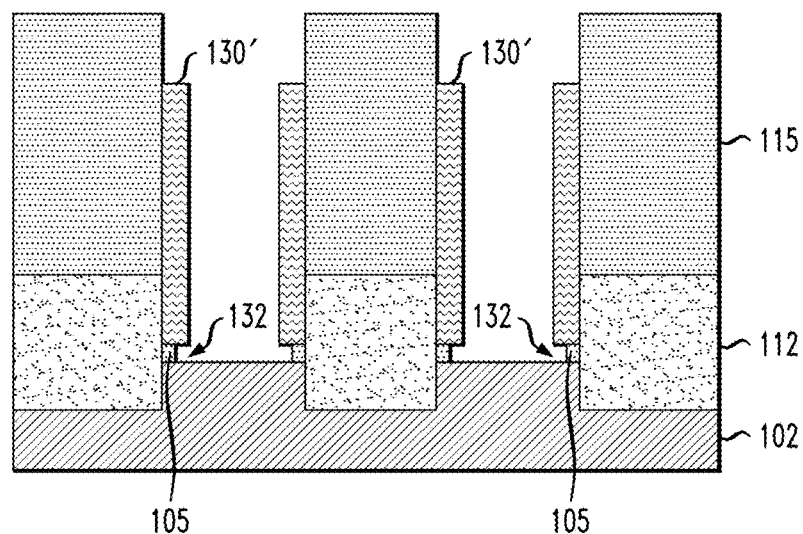
FIG. 11 is a cross-sectional view illustrating removal of portions of the sacrificial dielectric layer in a method of manufacturing a semiconductor device, according to an exemplary embodiment of the present invention.

FIG. 11 is a cross-sectional view illustrating removal of portions of the sacrificial dielectric layer in a method of manufacturing a semiconductor device, according to an exemplary embodiment of the present invention. Referring to FIG. 11, an isotropic etch process is performed to remove portions of the sacrificial dielectric layer 105 to result in undercut regions (referred to herein as "divots") 132 undercutting the sacrificial dielectric layer 105 under the spacers 130'. The isotropic etch process can be performed using, for example, an aqueous etchant containing hydrofluoric acid. Alternatively, a chemical oxide removal (COR) process can be used to etch oxides. In accordance with an embodiment of the present invention, the width of the spacers 130' with respect to the side surfaces of the dielectric layers 115 or source/drain regions 112 is, but not necessarily limited to, about 4 nm to about 8 nm, and the width of the remaining portions of the dielectric layer 105 with respect to the side surfaces of the source/drain regions 112 is, but not necessarily limited to, about 2 nm to about 5 nm. In an alternative embodiment, the divot 132 is not created, and the width of the remaining portions of the dielectric layer 105 is the same or substantially the same as the width of the spacers 130'.

Figure 12:
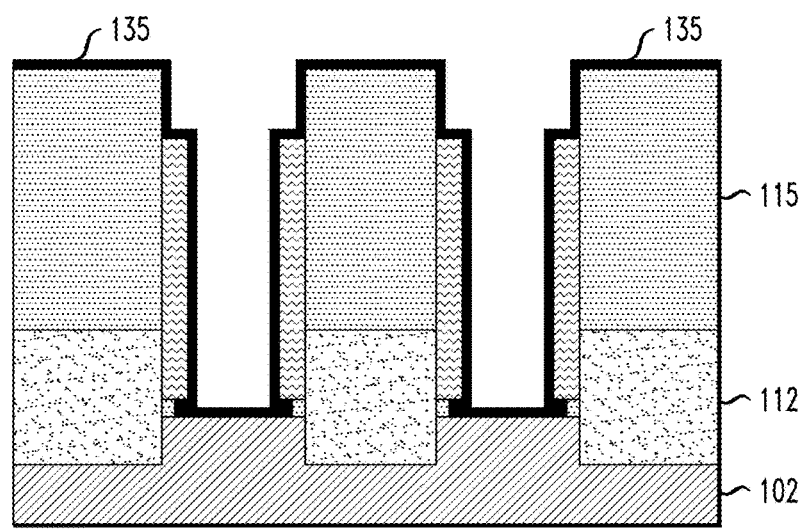
FIG. 12 is a cross-sectional view illustrating deposition of a gate dielectric layer in a method of manufacturing a semiconductor device, according to an exemplary embodiment of the present invention.

FIG. 12 is a cross-sectional view illustrating deposition of a gate dielectric layer (e.g., a high-k film layer) in a method of manufacturing a semiconductor device, according to an exemplary embodiment of the present invention. Referring to FIG. 12, a gate dielectric layer 135, including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide), or any suitable combination of those materials, is conformally deposited on the resulting structure from FIG. 11, including in the divots 132 to pinch off the divots 132 under the spacers 130'. In some embodiments, the gate dielectric layer 135 may comprise an interfacial layer (e.g., silicon oxide, silicon oxynitride) between a high-k film and the active region of substrate 102. The conformal deposition process can include, for example, ALD or MLD. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 13:
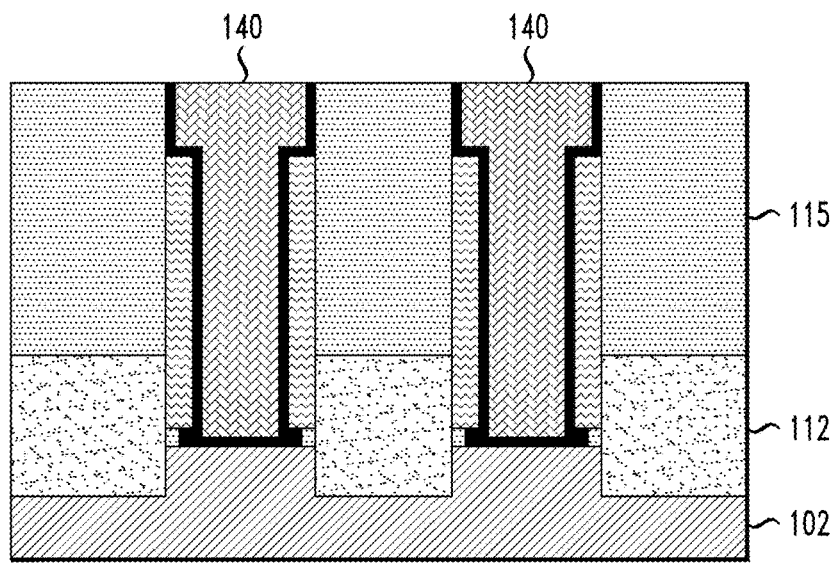
FIG. 13 is a cross-sectional view illustrating deposition of gate structure layers in a method of manufacturing a semiconductor device, according to an exemplary embodiment of the present invention.

FIG. 13 is a cross-sectional view illustrating deposition of gate structure layers in a method of manufacturing a semiconductor device, according to an exemplary embodiment of the present invention. Referring to FIG. 13, a gate structure 140 is deposited in each of the trenches 119 on the gate dielectric (e.g., high-k film) layer 135. According to an embodiment, the gate structure includes a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer 135. The gate structure can further include a gate layer including, but not necessarily limited to, amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer 135. According to an embodiment, excess portions of the gate structure 140 and gate dielectric layer 135 on upper surfaces of the dielectric layer 115 can be removed using a planarization process, such as CMP, which planarizes the structure to result in structure similar to that shown in FIG. 13.

Figure 14:
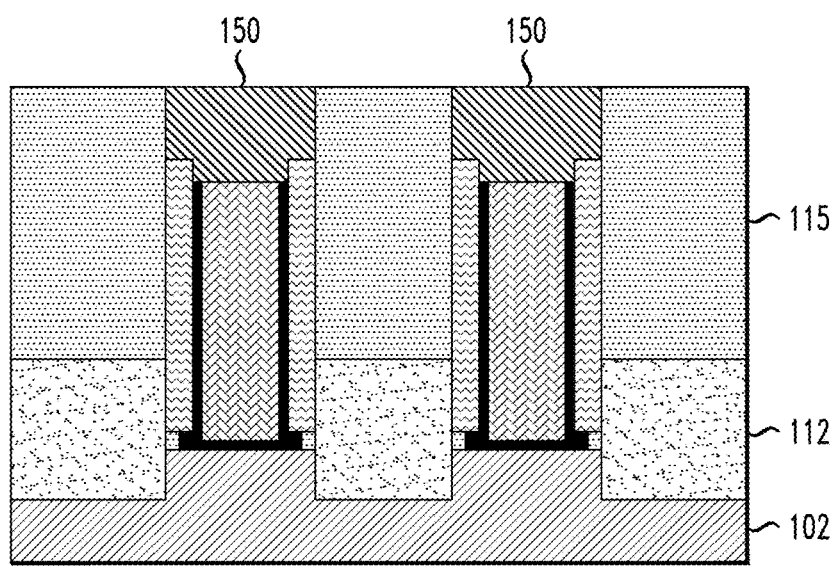
FIG. 14 is a cross-sectional view illustrating recessing of gate structure layers and deposition of cap layers in a method of manufacturing a semiconductor device, according to an exemplary embodiment of the present invention.

FIG. 14 is a cross-sectional view illustrating recessing of gate structure layers and deposition of cap layers in a method of manufacturing a semiconductor device, according to an exemplary embodiment of the present invention. Referring to FIG. 14, the gate dielectric and gate structure layers 135, 140 in the trenches 119 are recessed for example, by recessing the gate structure 140 first, and then etching the exposed gate dielectric layer (e.g., high-k film) 135. The vacancies left by the removed portions of the gate dielectric and gate structure layers 135, 140 after recessing are filled in with a self-aligned contact (SAC) cap layer 150, comprising, for example, SiN, SiOC, SiCN, SiBCN, or SiBN. The cap layers 150 facilitate downstream processing by protecting the gate structures 140, where other structures are formed on the cap layers 150. The cap layers also extend the spacers 130' on top surfaces thereof. As can be seen in FIG. 14, the recessing of the gate dielectric and gate structure layers 135, 140 can result in the spacers 130' having a greater height than the recessed gate dielectric and gate structure layers 135, 140. The cap layers 150 can be deposited using deposition techniques, including, but not limited to, CVD, PECVD, RFCVD, PVD, ALD, MLD, MBD, PLD, LSMCD, and/or sputtering, followed by CMP to remove excess cap material.

Figure 15:
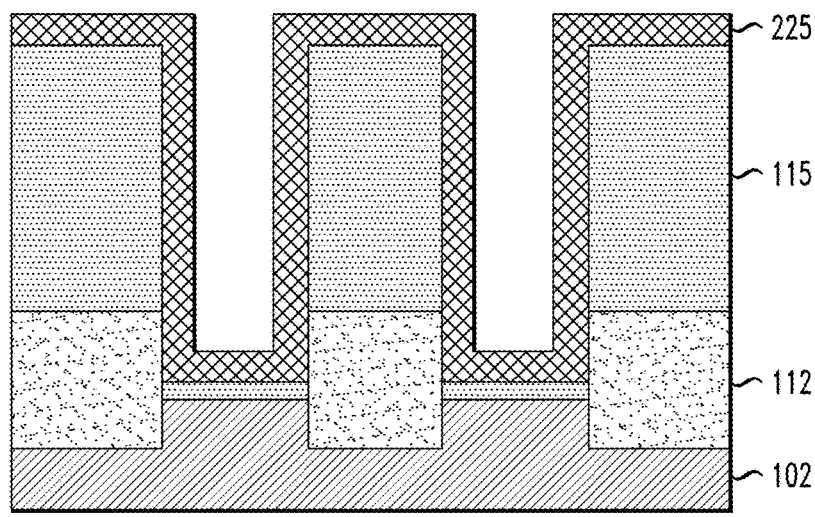
FIG. 15 is a cross-sectional view illustrating deposition of a dummy spacer layer in a method of manufacturing a semiconductor device, according to an exemplary embodiment of the present invention.

FIG. 15 is a cross-sectional view illustrating deposition of a dummy spacer layer in a method of manufacturing a semiconductor device, according to an exemplary embodiment of the present invention. Following the processing described in connection with FIGS. 1-5, referring to FIG. 15, for a device 200, a dummy spacer layer 225 comprising, for example, amorphous carbon (aC), or amorphous silicon is conformally deposited on the resulting structure from FIG. 5. The conformal deposition process can include, for example, ALD, CVD, or MLD.

Figure 16:
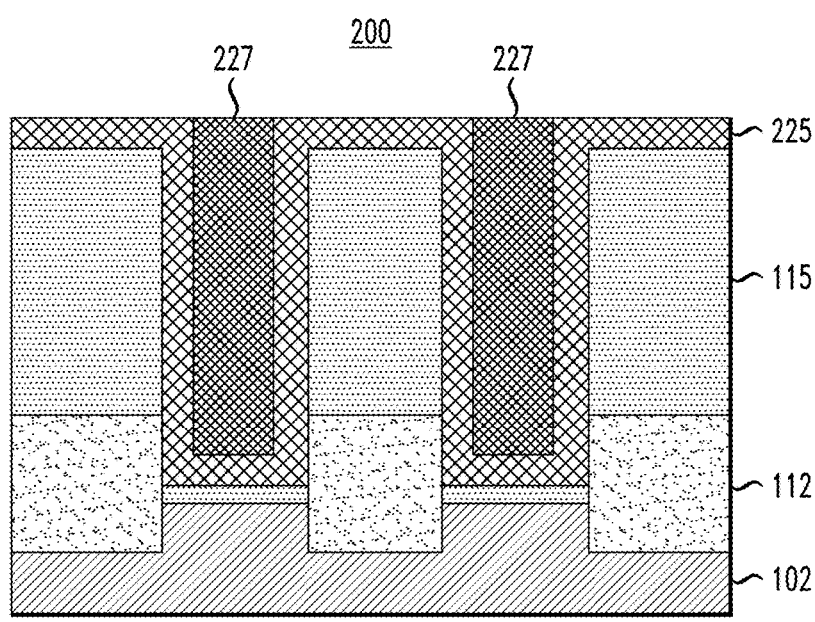
FIG. 16 is a cross-sectional view illustrating dielectric layer deposition on the dummy spacer layer in gate regions in a method of manufacturing a semiconductor device, according to an exemplary embodiment of the present invention.

FIG. 16 is a cross-sectional view illustrating dielectric layer deposition on the dummy spacer layer in gate regions in a method of manufacturing a semiconductor device, according to an exemplary embodiment of the present invention. Referring to FIG. 16, a dielectric layer 227 including, for example, silicon carbon oxynitride (SiOCN), or silicon nitride is deposited on the dummy spacer layer 227 to fill in a remaining area in the trenches 119. The dielectric layer 227 can be deposited using deposition techniques, including, but not limited to, CVD, PECVD, RFCVD, PVD, ALD, MLD, MBD, PLD, LSMCD, and/or sputtering.

Figure 17:
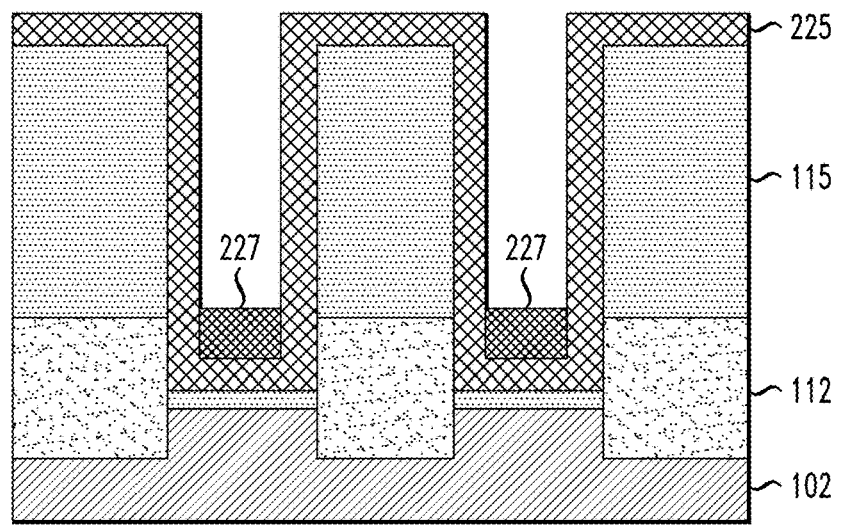
FIG. 17 is a cross-sectional view illustrating recessing of the dielectric layer deposited in the gate regions in a method of manufacturing a semiconductor device, according to an exemplary embodiment of the present invention.

FIG. 17 is a cross-sectional view illustrating recessing of the dielectric layer deposited in the gate regions in a method of manufacturing a semiconductor device, according to an exemplary embodiment of the present invention. Referring to FIG. 17, the dielectric layer 227 is etched back to recess the dielectric layer 227 to a lower height in each trench 119. The etch back can be performed using, for example, ME.

Figure 18:
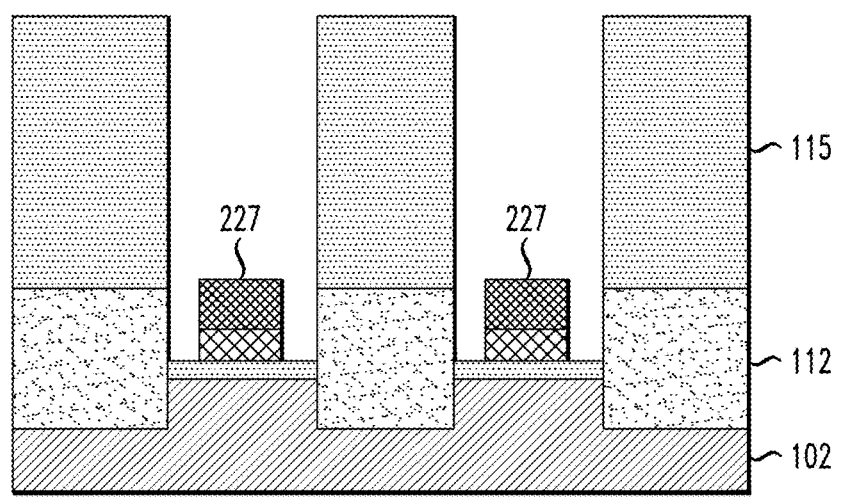
FIG. 18 is a cross-sectional view illustrating removal of portions of the dummy spacer layer in a method of manufacturing a semiconductor device, according to an exemplary embodiment of the present invention.

FIG. 18 is a cross-sectional view illustrating removal of portions of the dummy spacer layer in a method of manufacturing a semiconductor device, according to an exemplary embodiment of the present invention. Referring to FIG. 18, the majority of the dummy spacer layer 225 on the dielectric layers 115 and in the trenches 119 is removed using, for example, isotropic etching with, for example, hot phosphoric acid to etch a SiN dummy spacer followed by directional etching with, for example, ME. Portions of the dummy spacer layer 225 remain under the remaining portions of the etched back dielectric layer 227 in each trench 119. The etching of the dummy spacer layer 225 is selective with respect to the source/drain regions 112 and the dielectric layers 105, 115 and 227.

Figure 19:
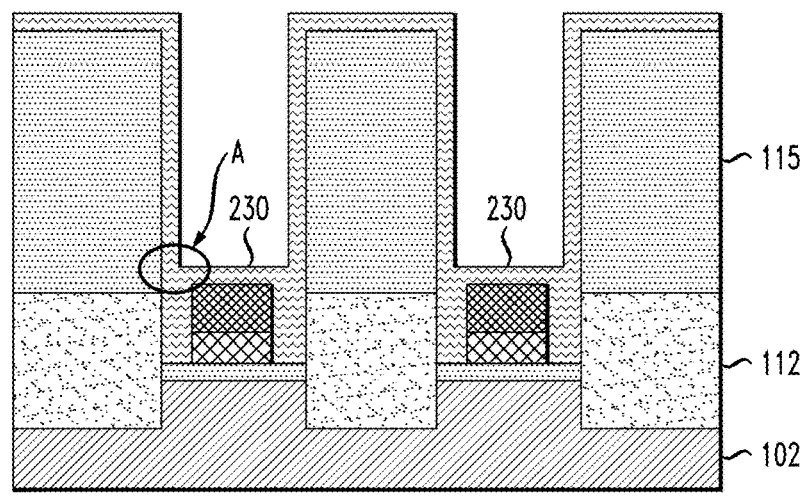
FIG. 19 is a cross-sectional view illustrating low-k spacer deposition in a method of manufacturing a semiconductor device, according to an exemplary embodiment of the present invention.

FIG. 19 is a cross-sectional view illustrating low-k spacer deposition in a method of manufacturing a semiconductor device, according to an exemplary embodiment of the present invention. Referring to FIG. 19, a low-k spacer material 230, such as, for example, SiOCN, SiBCN, SiOC, SiCN, SiBN, or SiON, is conformally deposited on all exposed surfaces, including on sidewalls of the dielectric layers 115 and source/drain regions 112, and sidewalls of the dielectric layer 227 and dummy spacer layer 225 stack in the trenches 119. The spacer material 230 is also deposited on horizontal surfaces of the dielectric layers 105, 115 and 227. The spacer material 230 can be deposited using conformal deposition techniques, including, but not limited to, ALD or MLD.

As can be seen by the circled portion, due to the deposition occurring on all exposed surfaces, the spacer material 230 has thicker portions near the lower portion of the trenches 119 where there are opposing surfaces in relatively close proximity for deposition to take place and fill-in vacant portions more quickly, as opposed to an upper portion of the trenches 119 where there are not opposing surfaces in relatively close proximity. Note, for example, the thickness difference between $t_1$ and $t_2$ in FIG. 21.

Figure 20:
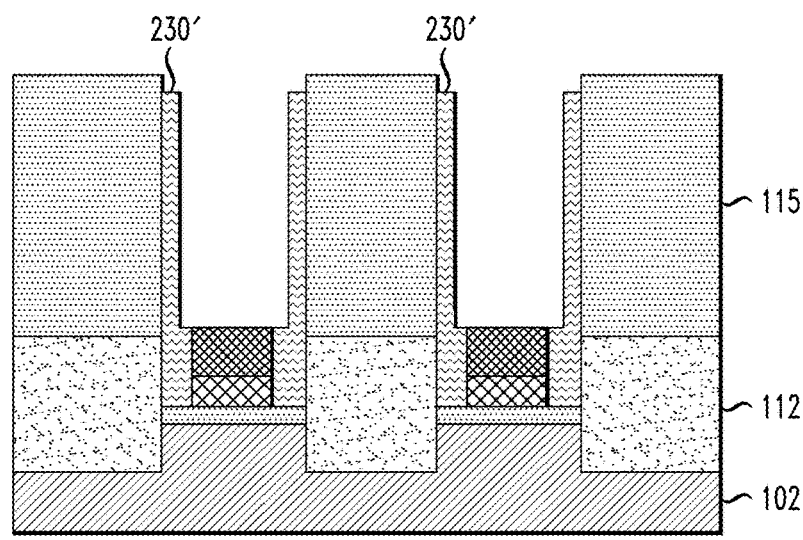
FIG. 20 is a cross-sectional view illustrating removal of parts of the low-k spacer in a method of manufacturing a semiconductor device, according to an exemplary embodiment of the present invention.

FIG. 20 is a cross-sectional view illustrating removal of parts of the low-k spacer in a method of manufacturing a semiconductor device, according to an exemplary embodiment of the present invention. Referring to FIG. 20, a directional etch using, example, ME, is performed to remove portions the spacer material 230 from horizontal upper surfaces of the dielectric layers 115 and 227, and to recess the spacer material 230 to a lower height within the trenches 119 to form spacer patterns 230'.

Figure 21:
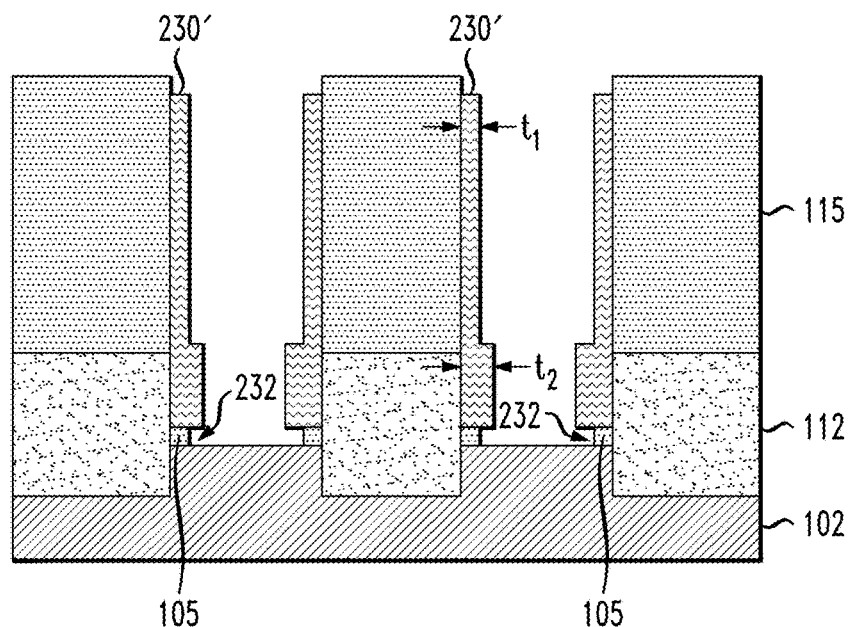
FIG. 21 is a cross-sectional view illustrating stripping of the dielectric layer and remaining dummy spacer layer and removal of part of the sacrificial dielectric layer in gate regions in a method of manufacturing a semiconductor device, according to an exemplary embodiment of the present invention.

FIG. 21 is a cross-sectional view illustrating stripping of the dielectric layer and remaining dummy spacer layer and removal of part of the sacrificial dielectric layer in gate regions in a method of manufacturing a semiconductor device, according to an exemplary embodiment of the present invention. Referring to FIG. 21, the stack of the remaining dielectric layer 227 on the remaining dummy spacer layer 225 are removed from the trenches 119. In order to remove the stacks, if dielectric layer 227 is silicon nitride, layer 227 can be removed by hot phosphoric acid, and if the dummy spacer layer 225 is amorphous carbon, it can be removed by ashing containing oxygen plasma.

An isotropic etch process is performed to remove portions of the sacrificial dielectric layer 105 to result in divots 232 undercutting the sacrificial dielectric layer 105 under the spacer patterns 230'. The isotropic etch process can be performed using, for example, an aqueous etchant containing hydrofluoric acid. Alternatively, a COR process can be used to etch oxides. In accordance with an embodiment of the present invention, the first width $t_1$ of the spacer patterns 230' with respect to the side surfaces of the dielectric layers 115 is about 3 nm to about 5 nm, the second width $t_2$ of the spacer patterns 230' with respect to the side surfaces of the dielectric layers 115 or source/drain regions 112 is about 5 to about 8 nm, and the width of the remaining portions of the dielectric layer 105 with respect to the side surfaces of the source/drain regions 112 is about 2 nm to bout 4 nm. In an alternative embodiment, the divot 232 is not created, and the width of the remaining portions of the dielectric layer 105 is the same or substantially the same as width $t_2$ of the spacer patterns 230'.

Figure 22:
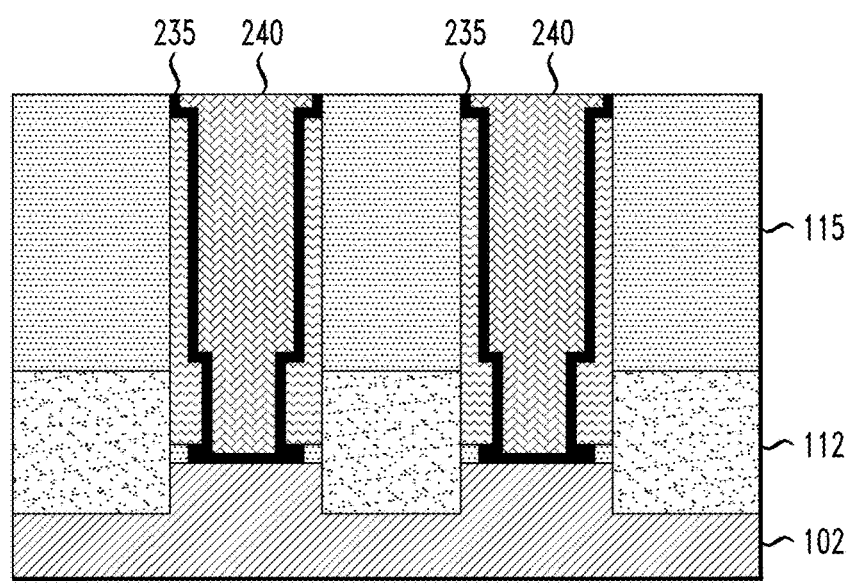
FIG. 22 is a cross-sectional view illustrating deposition of gate dielectric layers and gate structure layers in a method of manufacturing a semiconductor device, according to an exemplary embodiment of the present invention.

FIG. 22 is a cross-sectional view illustrating deposition of gate dielectric (e.g., high-k film) layers and gate structure layers in a method of manufacturing a semiconductor device, according to an exemplary embodiment of the present invention. Referring to FIG. 22, a gate dielectric layer 235, including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide, is conformally deposited on the resulting structure from FIG. 21, including in the divots 232 to pinch off the divots 232 under the spacer patterns 230'. The conformal deposition process can include, for example, ALD or MLD. Other examples of high-k materials can include the same materials as those discussed in connection with FIG. 12.

A gate structure 240 is deposited in each of the trenches 119 on the gate dielectric layer 235. According to an embodiment, the gate structure includes a work-function metal (WFM) layer, which can be deposited on the gate dielectric layer 235 and include the same materials as those discussed in connection with FIG. 13. The gate structure can further include a gate layer deposited on the WFM layer and the gate dielectric layer 235 and including the same materials as those discussed in connection with FIG. 13. According to an embodiment, excess portions of the gate structure 240 and gate dielectric layer 235 on upper surfaces of the dielectric layer 115 can be removed using a planarization process, such as CMP, which planarizes the structure to result in structure similar to that shown in FIG. 22.

Figure 23:
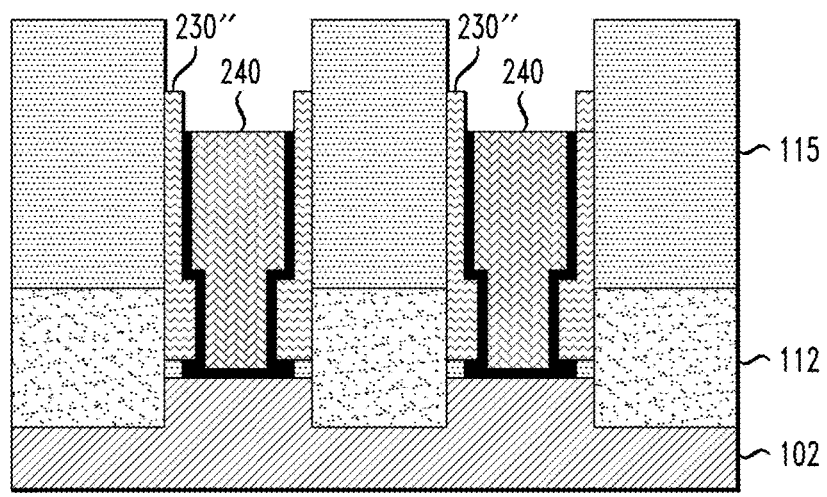
FIG. 23 is a cross-sectional view illustrating recessing of gate dielectric, gate structure and low-k spacer layers in a method of manufacturing a semiconductor device, according to an exemplary embodiment of the present invention.

FIG. 23 is a cross-sectional view illustrating recessing of gate dielectric (e.g., high-k film), gate structure and low-k spacer layers in a method of manufacturing a semiconductor device, according to an exemplary embodiment of the present invention. Referring to FIG. 23, the spacer patterns 230', and the gate dielectric and gate structure layers 235, 240 in the trenches 119 are recessed for example, by recessing the gate structure 240 first, and then etching the exposed gate dielectric layer (e.g., high-k film) 235 and spacer patterns 230'. The recessing of the spacer patterns 230', and the gate dielectric and gate structure layers 235, 240 can result in the spacers 230" that are shorter in height than the spacer patterns 230', while having a greater height than the recessed gate dielectric and gate structure layers 235, 240.

Figure 24:
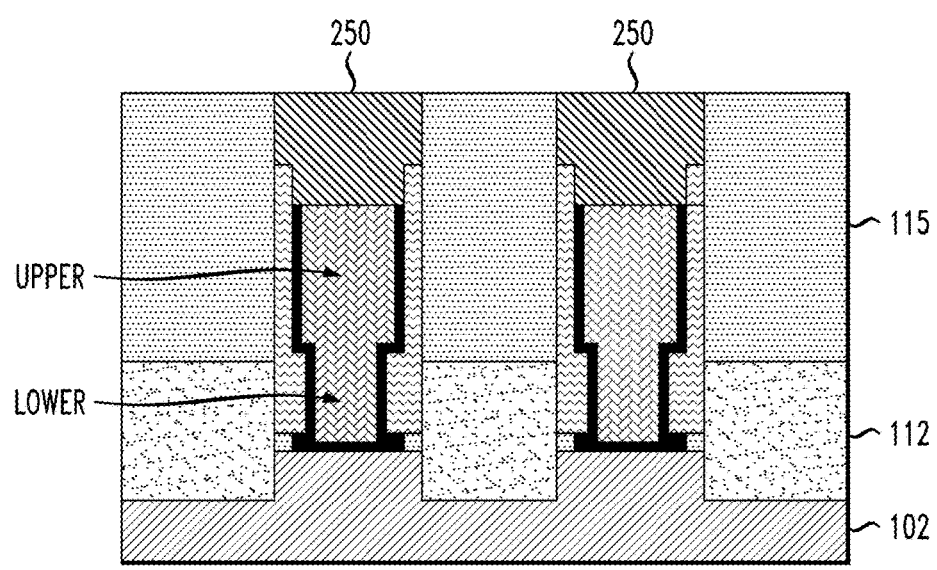
FIG. 24 is a cross-sectional view illustrating deposition of cap layers in a method of manufacturing a semiconductor device, according to an exemplary embodiment of the present invention.

FIG. 24 is a cross-sectional view illustrating deposition of cap layers in a method of manufacturing a semiconductor device, according to an exemplary embodiment of the present invention. Referring to FIG. 24, the vacancies left by the removed portions of the spacer patterns 230', and the gate dielectric and gate structure layers 235, 240 after recessing are filled in with a self-aligned contact (SAC) cap layer 250, comprising, for example, SiN, SiOC, SiCN, SiBCN, or SiBN. The cap layers 250 facilitate downstream processing by protecting the gate structures 240, where other structures are formed on the cap layers 250. The cap layers also extend the spacers 230" on top surfaces thereof. The cap layers 250 can be deposited using deposition techniques, including, but not limited to, CVD, PECVD, RFCVD, PVD, ALD, MLD, MBD, PLD, LSMCD, and/or sputtering, followed by CMP to remove excess cap material.

The different thicknesses (also referred to herein as widths) $t_1$ and $t_2$ of the spacers 230" (see FIG. 21) cause gate structures 240 having a T-shape, where an upper portion is wider than a lower portion (see portions labeled "upper" and "lower" in FIG. 24). As a result, a gate structure having a relatively small gate length, which is measured based on the width of the lower portion, can have a lower resistance than a conventional gate structure with a constant width and having the same gate length. The wider upper portion of the gate structure 240 as shown in FIG. 24 lowers the resistance of the gate when compared with a conventional structure, while the gate length, based on the narrower lower portion is maintained.

Figure 25:
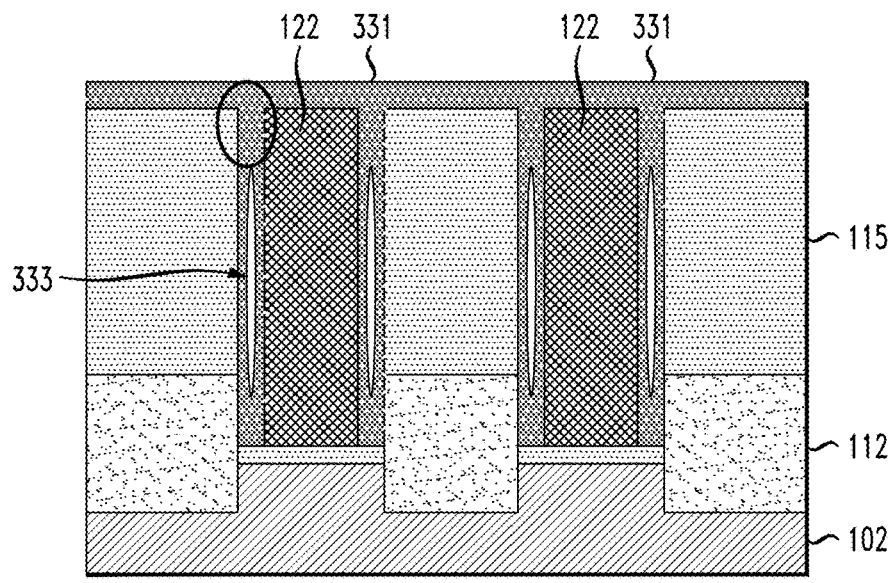
FIG. 25 is a cross-sectional view illustrating spacer deposition wherein airgaps are formed in a method of manufacturing a semiconductor device, according to an exemplary embodiment of the present invention.

FIG. 25 is a cross-sectional view illustrating spacer deposition wherein airgaps are formed in a method of manufacturing a semiconductor device, according to an exemplary embodiment of the present invention. Following the processing described in connection with FIGS. 1-8, referring to FIG. 25, for a device 300, a dielectric spacer material 331, such as, for example, silicon-boron-carbon-nitride (SiBCN), is deposited to fill in the gaps on the opposite sides of the middle polymer layers 122 left by the removal of the two side polymer layers 124. The spacer material 331 is also deposited on upper surfaces of the dielectric and middle polymer layers 115, 122. In accordance with an embodiment of the present invention, the spacer material 331 is deposited using non-conformal deposition techniques, including, but not limited to, PECVD, high density plasma CVD (HDP-CVD), CVD, or any suitable combination of those processes. During the non-conformal deposition process, more material is deposited at upper portions of the structure than at lower portions of the structure. As a result, upper portions of the spacer material (e.g., see circled portion in FIG. 25) fill in before permitting the spacer material to completely fill in areas below the filled in upper portions, so that airgaps 333 are created. The filled in upper portions of the spacer material 331 block additional spacer material from being formed in underlying areas, where airgaps 333 are formed instead. Given the dielectric constant of air at 1 atm (1.00059), the air in airgaps 333 functions as a low-k dielectric.

Figure 26:
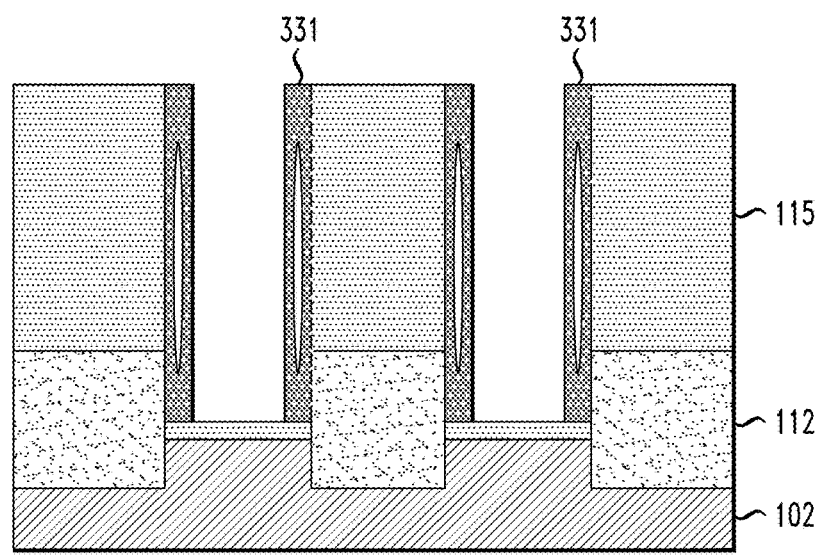
FIG. 26 is a cross-sectional view illustrating stripping of second polymer layers and removal of portions of the spacer material in a method of manufacturing a semiconductor device, according to an exemplary embodiment of the present invention.

FIG. 26 is a cross-sectional view illustrating stripping of second polymer layers and removal of portions of the spacer material in a method of manufacturing a semiconductor device, according to an exemplary embodiment of the present invention. Referring to FIG. 26, an etch process (e.g., RIE) is performed to remove the spacer material 331 from horizontal upper surfaces of the dielectric layer 115 and middle polymer layers 122. The middle polymer layers 122 are removed from the trenches 119. A stripping process, such as, but not necessarily limited to, ashing, is used to selectively remove the middle polymer layers 122. The removed middle polymer layers 122 result in respective gaps between the remaining spacer material 331.

Figure 27:
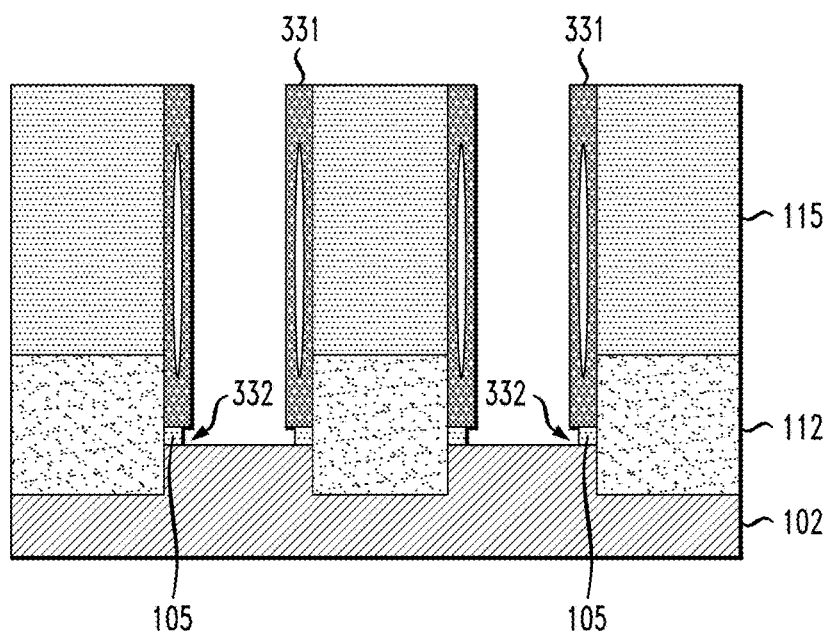
FIG. 27 is a cross-sectional view illustrating removal of portions of the sacrificial dielectric layer in a method of manufacturing a semiconductor device, according to an exemplary embodiment of the present invention.

FIG. 27 is a cross-sectional view illustrating removal of portions of the sacrificial dielectric layer in a method of manufacturing a semiconductor device, according to an exemplary embodiment of the present invention. Referring to FIG. 27, an isotropic etch process is performed to remove portions of the sacrificial dielectric layer 105 to result in divots 332 undercutting the sacrificial dielectric layer 105 under the remaining spacer material 331. The isotropic etch process can be performed using, for example, an aqueous etchant containing hydrofluoric acid. Alternatively, a COR process can be used to etch oxides. In accordance with an embodiment of the present invention, the remaining spacer material 331 with respect to the side surfaces of the dielectric layers 115 or source/drain regions 112 is, in a non-limiting example, about 4 nm to about 8 nm, and the width of the remaining portions of the dielectric layer 105 with respect to the side surfaces of the source/drain regions 112 is, in a non-limiting example, about 2 nm to about 5 nm. In an alternative embodiment, the divot 332 is not created, and the width of the remaining portions of the dielectric layer 105 is the same or substantially the same as the width of the remaining spacer material 331.

Figure 28:
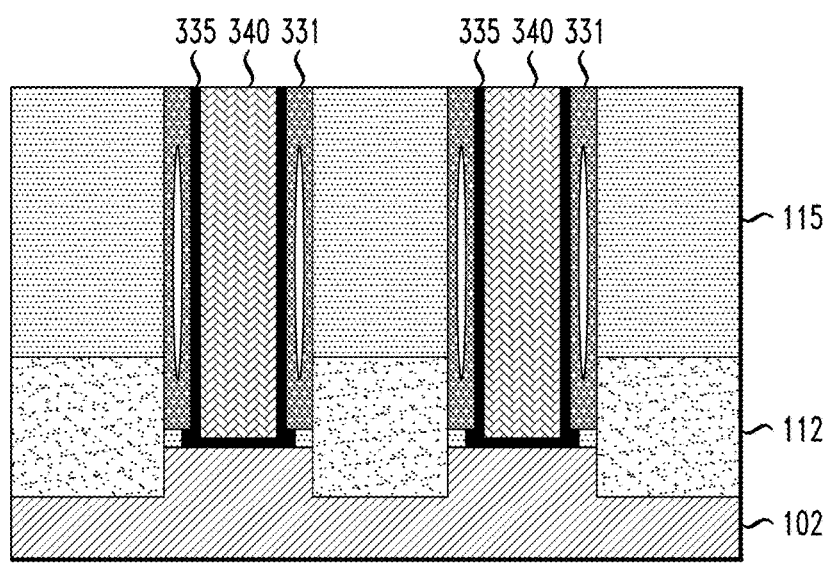
FIG. 28 is a cross-sectional view illustrating deposition of gate dielectric and gate structure layers in a method of manufacturing a semiconductor device, according to an exemplary embodiment of the present invention.

FIG. 28 is a cross-sectional view illustrating deposition of gate dielectric (e.g., high-k film) and gate structure layers in a method of manufacturing a semiconductor device, according to an exemplary embodiment of the present invention. Referring to FIG. 28, a gate dielectric (e.g. high-k film) layer 335, including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide), or any suitable combination of those materials, is conformally deposited on the resulting structure from FIG. 27, including in the divots 332 to pinch off the divots 332 under the remaining spacer material. In some embodiment, the gate dielectric layer 335 may comprise an interfacial layer (e.g., silicon oxide, silicon oxynitride) between a high-k film and the active region of the substrate 102. The conformal deposition process can include, for example, ALD or MLD. Other examples of high-k materials can include the same materials as those discussed in connection with FIG. 12.

A gate structure 340 is deposited in each of the trenches 119 on the gate dielectric layer 335. According to an embodiment, the gate structure includes a work-function metal (WFM) layer, which can be deposited on the gate dielectric layer 335 and include the same materials as those discussed in connection with FIG. 13. The gate structure can further include a gate layer deposited on the WFM layer and the gate dielectric layer 335 and including the same materials as those discussed in connection with FIG. 13. According to an embodiment, excess portions of the gate structure 340 and gate dielectric layer 335 on upper surfaces of the dielectric layer 115 can be removed using a planarization process, such as CMP, which planarizes the structure to result in structure similar to that shown in FIG. 28.

Figure 29:
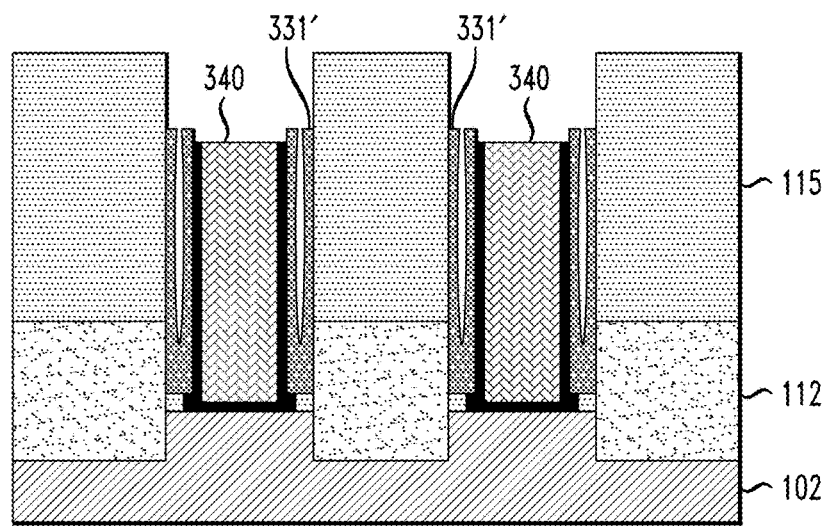
FIG. 29 is a cross-sectional view illustrating recessing of gate dielectric, gate structure and spacer layers in a method of manufacturing a semiconductor device, according to an exemplary embodiment of the present invention.

FIG. 29 is a cross-sectional view illustrating recessing of gate dielectric, gate structure and spacer layers in a method of manufacturing a semiconductor device, according to an exemplary embodiment of the present invention. Referring to FIG. 29, the spacer material 331, and the gate dielectric and gate structure layers 335, 340 in the trenches 119 are recessed. The recessing of the spacer material 331, and the gate dielectric and gate structure layers 335, 340 can result in the spacers 331', which have a greater height than the recessed gate dielectric and gate structure layers 335, 340.

Figure 30:
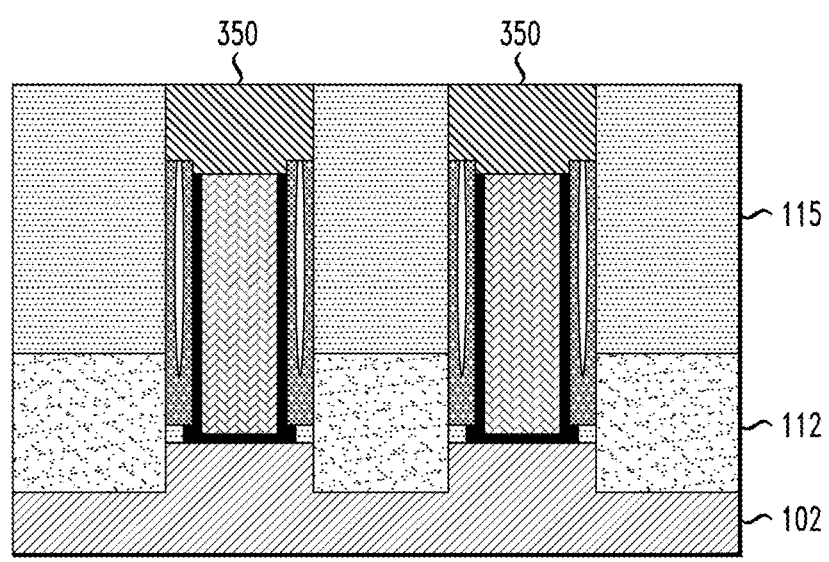
FIG. 30 is a cross-sectional view illustrating deposition of cap layers in a method of manufacturing a semiconductor device, according to an exemplary embodiment of the present invention.

FIG. 30 is a cross-sectional view illustrating deposition of cap layers in a method of manufacturing a semiconductor device, according to an exemplary embodiment of the present invention. Referring to FIG. 30, the vacancies left by the removed portions of the spacer material 331, and the gate dielectric and gate structure layers 335, 340 after recessing are filled in with a self-aligned contact (SAC) cap layer 350, comprising, for example, SiN, SiOC, SiCN, SiBCN, or SiBN. The cap layers 350 facilitate downstream processing by protecting the gate structures 340, where other structures are formed on the cap layers 350. The cap layers also extend the spacers 331' on top surfaces thereof. The cap layers 350 can be deposited using deposition techniques, including, but not limited to, CVD, PECVD, RFCVD, PVD, ALD, MLD, MBD, PLD, LSMCD, and/or sputtering, followed by CMP to remove excess cap material.

Figure 31:
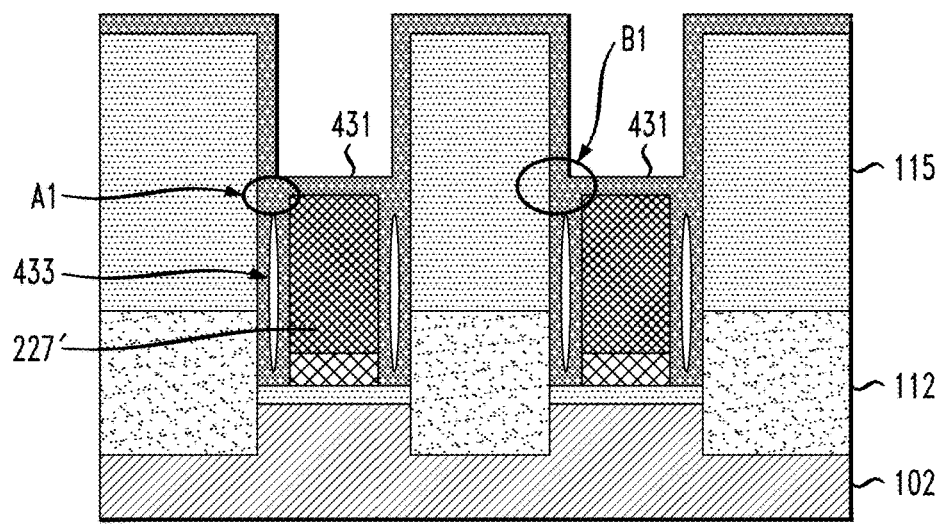
FIG. 31 is a cross-sectional view illustrating spacer deposition wherein airgaps are formed in a method of manufacturing a semiconductor device, according to an exemplary embodiment of the present invention.

FIG. 31 is a cross-sectional view illustrating spacer deposition wherein airgaps are formed in a method of manufacturing a semiconductor device, according to an exemplary embodiment of the present invention. With the exception of the taller height of layer 227' (as opposed to the height of layer 227 in FIGS. 17 and 18), FIG. 31 follows from FIG. 18. Referring to FIG. 31, for a device 300, a dielectric spacer material 431, such as, for example, silicon-boron-carbon-nitride (SiBCN), is deposited on all exposed surfaces, including on sidewalls of the dielectric layers 115 and source/drain regions 112, and sidewalls of the dielectric layer 227' and dummy spacer layer 225 stack in the trenches 119. The spacer material 431 is also deposited on horizontal surfaces of the dielectric layers 105, 115 and 227'. In accordance with an embodiment of the present invention, the spacer material 431 is deposited using non-conformal deposition techniques, including, but not limited to, PECVD, HDP-CVD, CVD, or any suitable combination of those processes. During the non-conformal deposition process, more material is deposited at upper portions of the structure than at lower portions of the structure. As a result, upper portions of the spacer material (e.g., see circled portion A1 in FIG. 31) fill in before permitting the spacer material to completely fill in areas below the filled in upper portions, so that airgaps 433 are created. The filled in upper portions of the spacer material 431 block additional spacer material from being formed in underlying areas, where airgaps 433 are formed instead. Given the dielectric constant of air at 1 atm (1.00059), the airgap 433 functions as a low-k dielectric.

As can be seen by the circled portion B1, due to the deposition occurring on all exposed surfaces, the spacer material 431 has thicker portions in the trenches 119 where there are opposing surfaces in relatively close proximity for deposition to take place and fill-in vacant portions more quickly, as opposed to an upper portion of the trenches 119 where there are not opposing surfaces in relatively close proximity. Note, for example, the thickness difference between $t_3$ and $t_4$ in FIG. 33.

Figure 32:
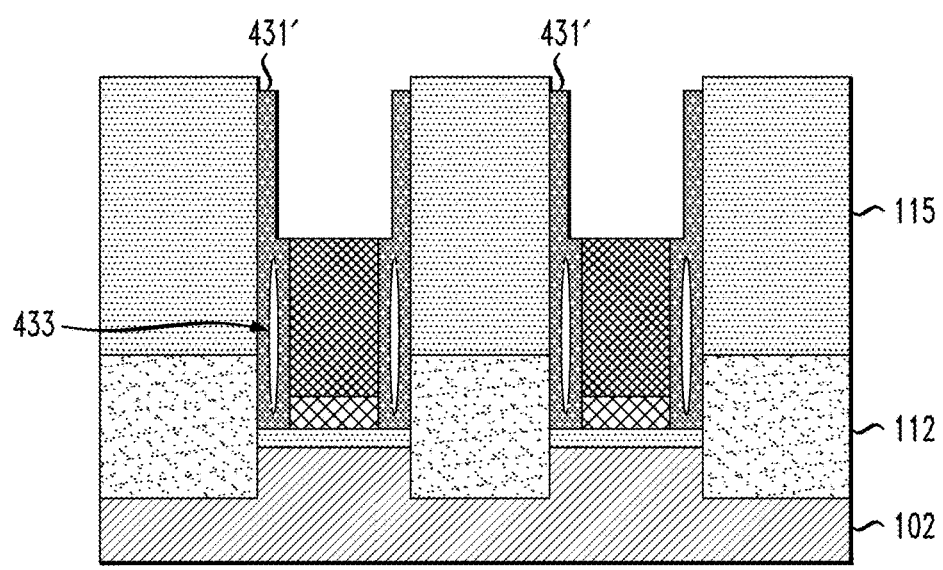
FIG. 32 is a cross-sectional view illustrating removal of parts of the spacer in a method of manufacturing a semiconductor device, according to an exemplary embodiment of the present invention.

FIG. 32 is a cross-sectional view illustrating removal of parts of the spacer in a method of manufacturing a semiconductor device, according to an exemplary embodiment of the present invention. Referring to FIG. 32, a directional etch using, example, RIE, is performed to remove portions the spacer material 431 from horizontal upper surfaces of the dielectric layers 115 and 227', and to recess the spacer material 431 to a lower height within the trenches 119 to form spacers 431'.

Figure 33:
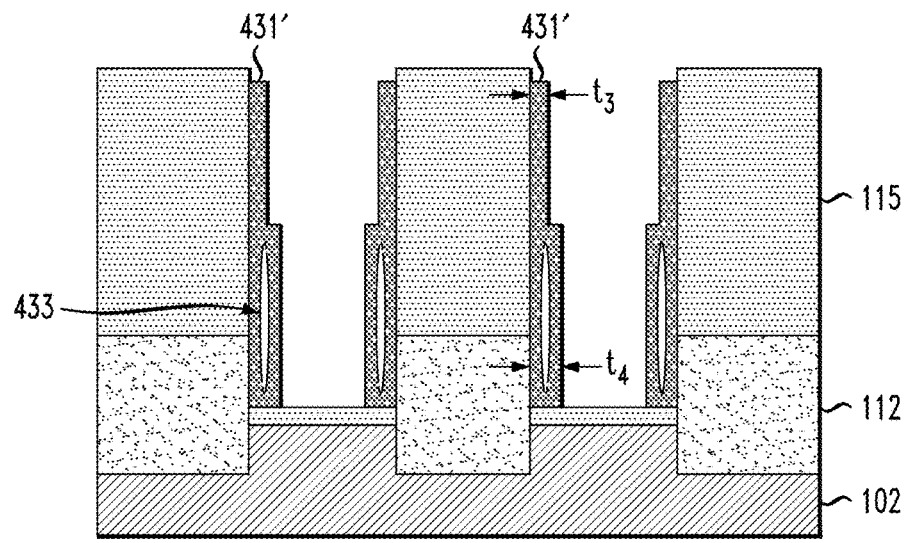
FIG. 33 is a cross-sectional view illustrating stripping of the dielectric layer and remaining dummy spacer layer in gate regions in a method of manufacturing a semiconductor device, according to an exemplary embodiment of the present invention.

FIG. 33 is a cross-sectional view illustrating stripping of the dielectric layer and remaining dummy spacer layer in gate regions in a method of manufacturing a semiconductor device, according to an exemplary embodiment of the present invention. Referring to FIG. 33, the stack of the remaining dielectric layer 227' on the remaining dummy spacer layer 225 are removed from the trenches 119. In order to remove the stacks, if dielectric layer 227' is silicon nitride, layer 227' can be removed by hot phosphoric acid, and if the dummy spacer layer 225 is amorphous carbon, it can be removed by ashing containing oxygen plasma.

Figure 34:
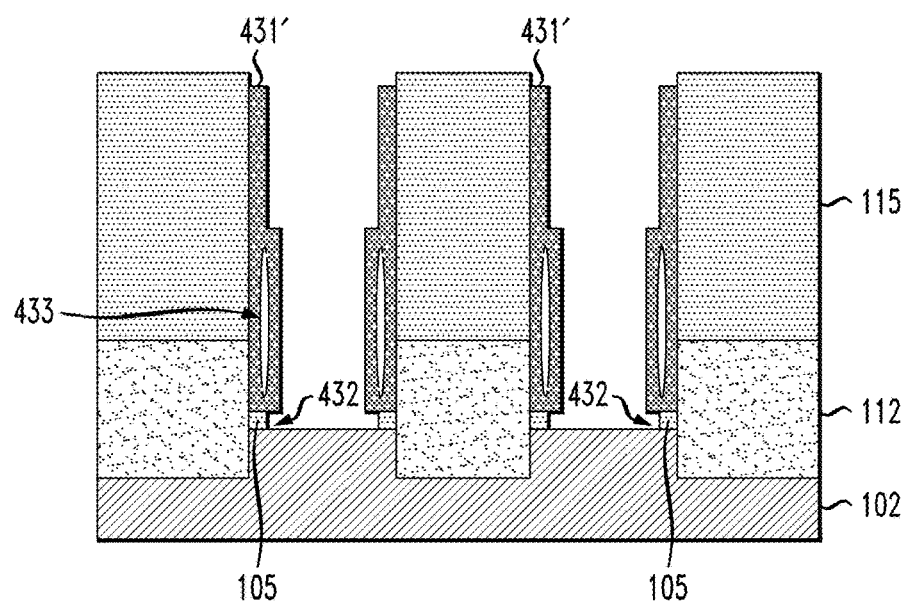
FIG. 34 is a cross-sectional view illustrating removal of part of the sacrificial dielectric layer in gate regions in a method of manufacturing a semiconductor device, according to an exemplary embodiment of the present invention.

FIG. 34 is a cross-sectional view illustrating removal of part of the sacrificial dielectric layer in gate regions in a method of manufacturing a semiconductor device, according to an exemplary embodiment of the present invention. Referring to FIG. 34, an isotropic etch process is performed to remove portions of the sacrificial dielectric layer 105 to result in divots 432 undercutting the sacrificial dielectric layer 105 under the spacers 431'. The isotropic etch process can be performed using, for example, an aqueous etchant containing hydrofluoric acid. Alternatively, a COR process can be used to etch oxides. In accordance with an embodiment of the present invention, the first width $t_3$ of the spacers 431' with respect to the side surfaces of the dielectric layers 115 is, for example about 3 nm to about 5 nm, the second width $t_4$ of the spacers 431' with respect to the side surfaces of the dielectric layers 115 or source/drain regions 112 is, for example, about 5 nm to about 8 nm, and the width of the remaining portions of the dielectric layer 105 with respect to the side surfaces of the source/drain regions 112 is about 2 nm to about 4 nm. In an alternative embodiment, the divot 432 is not created, and the width of the remaining portions of the dielectric layer 105 is the same or substantially the same as width $t_4$ of the spacers 431'.

Figure 35:
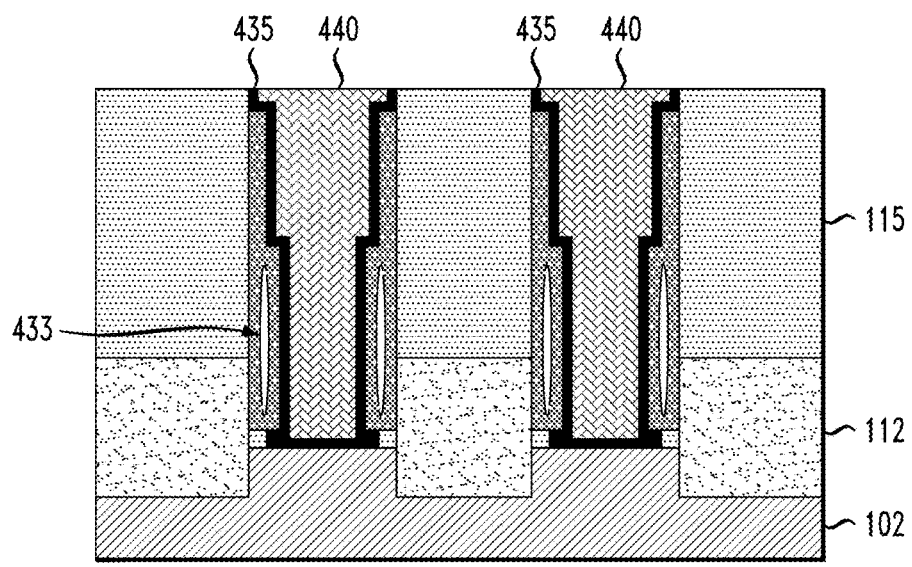
FIG. 35 is a cross-sectional view illustrating deposition of gate dielectric layers and gate structure layers in a method of manufacturing a semiconductor device, according to an exemplary embodiment of the present invention.

FIG. 35 is a cross-sectional view illustrating deposition of gate dielectric layers and gate structure layers in a method of manufacturing a semiconductor device, according to an exemplary embodiment of the present invention. Referring to FIG. 35, a gate dielectric (e.g., high-k film layer) 435, including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide, is conformally deposited on the resulting structure from FIG. 34, including in the divots 432 to pinch off the divots 432 under the spacers 431'. The conformal deposition process can include, for example, ALD or MLD. Other examples of high-k materials can include the same materials as those discussed in connection with FIG. 12.

A gate structure 440 is deposited in each of the trenches 119 on the gate dielectric layer 435. According to an embodiment, the gate structure includes a work-function metal (WFM) layer, which can be deposited on the gate dielectric layer 435 and include the same materials as those discussed in connection with FIG. 13. The gate structure can further include a gate layer deposited on the WFM layer and the gate dielectric layer 435 and including the same materials as those discussed in connection with FIG. 13. According to an embodiment, excess portions of the gate structure 440 and gate dielectric layer 435 on upper surfaces of the dielectric layer 115 can be removed using a planarization process, such as CMP, which planarizes the structure to result in structure similar to that shown in FIG. 35.

Figure 36:
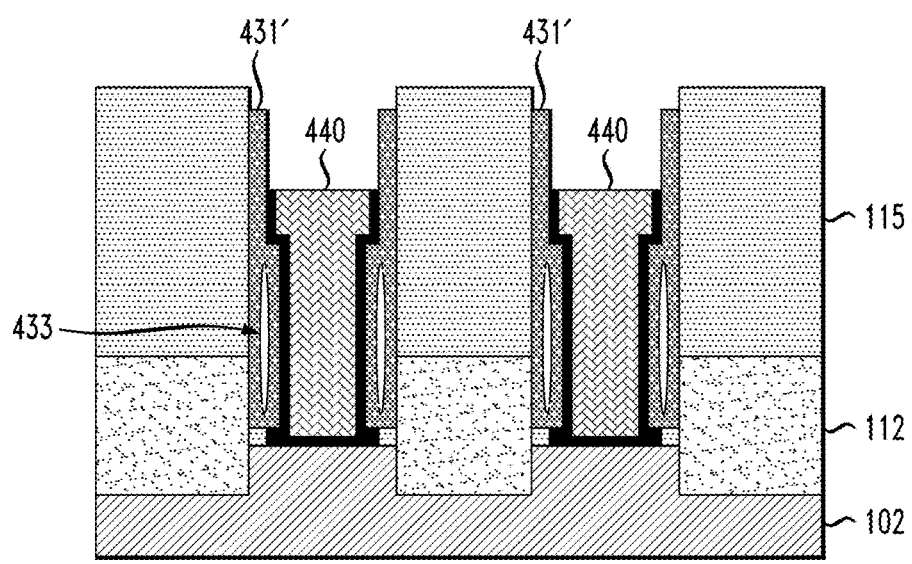
FIG. 36 is a cross-sectional view illustrating recessing of gate dielectric and gate structure layers in a method of manufacturing a semiconductor device, according to an exemplary embodiment of the present invention.

FIG. 36 is a cross-sectional view illustrating recessing of gate dielectric and gate structure layers in a method of manufacturing a semiconductor device, according to an exemplary embodiment of the present invention. Referring to FIG. 36, the gate dielectric and gate structure layers 435, 440 in the trenches 119 are recessed for example, by recessing the gate structure 440 first, and then etching the exposed gate dielectric layer (e.g., high-k film) 435. The recessing of the gate dielectric and gate structure layers 435, 440 results in the spacers 431' having a greater height than the recessed gate dielectric and gate structure layers 435, 440.

Figure 37:
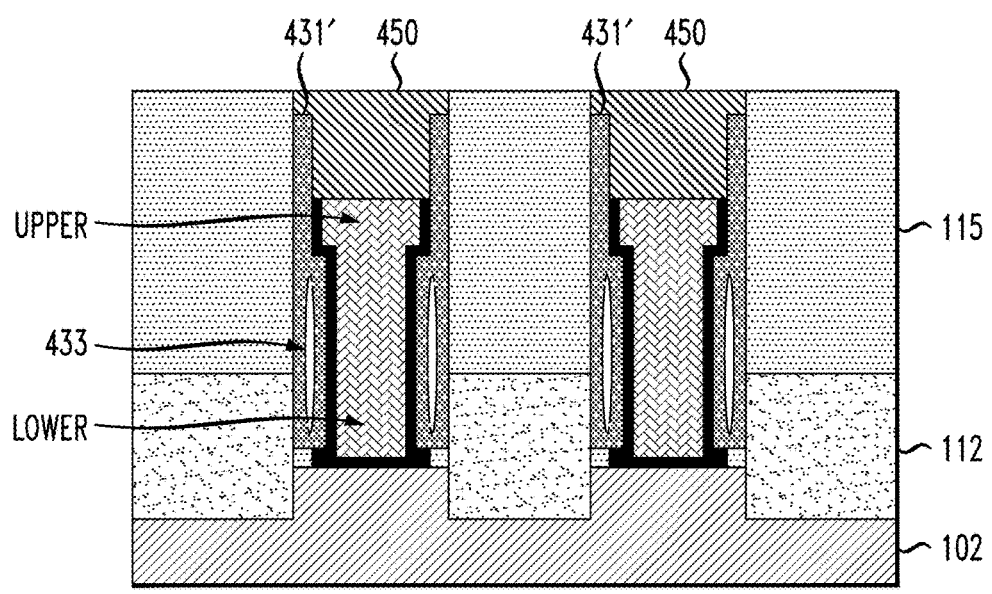
FIG. 37 is a cross-sectional view illustrating deposition of cap layers in a method of manufacturing a semiconductor device, according to an exemplary embodiment of the present invention.

FIG. 37 is a cross-sectional view illustrating deposition of cap layers in a method of manufacturing a semiconductor device, according to an exemplary embodiment of the present invention. Referring to FIG. 37, the vacancies left by the removed portions of the spacer material 431, and the gate dielectric and gate structure layers 435, 440 after recessing are filled in with a self-aligned contact (SAC) cap layer 450, comprising, for example, SiN, SiOC, SiCN, SiBCN, or SiBN. The cap layers 450 facilitate downstream processing by protecting the gate structures 440, where other structures are formed on the cap layers 450. The cap layers also extend the spacers 431' on top surfaces thereof. The cap layers 450 can be deposited using deposition techniques, including, but not limited to, CVD, PECVD, RFCVD, PVD, ALD, MLD, MBD, PLD, LSMCD, and/or sputtering, followed by CMP to remove excess cap material.

The different thicknesses (also referred to herein as widths) $t_3$ and $t_4$ of the spacers 431' (see FIG. 33) cause gate structures 440 having a T-shape, where an upper portion is wider than a lower portion (see portions labeled "upper" and "lower" in FIG. 37). As a result, a gate structure having a relatively small gate length, which is measured based on the width of the lower portion, can have a lower resistance than a conventional gate structure with a constant width and having the same gate length. The wider upper portion of the gate structure 440 as shown in FIG. 37 lowers the resistance of the gate when compared with a conventional structure, while the gate length, based on the narrower lower portion is maintained.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a sacrificial dielectric layer on a substrate;
   forming a plurality of dummy gate patterns spaced apart from each other on the sacrificial dielectric layer;
   removing exposed portions of the sacrificial dielectric layer adjacent the plurality of dummy gate patterns;
   growing a plurality of source/drain regions adjacent the plurality of dummy gate patterns;
   forming a dielectric layer on each of the plurality of source/drain regions adjacent the plurality of dummy gate patterns;
   removing the plurality of dummy gate patterns to create a plurality of trenches;
   forming a plurality of spacers on sidewalls of each of the plurality of trenches, wherein the plurality of spacers comprise at least one of a low-k material and an airgap; and
   forming a gate structure in each of the plurality of trenches between the plurality of spacers.

2. The method according to claim 1, wherein a width of each dummy gate pattern comprises at least a width of the gate structure and a combined width of the spacers on either side of the gate structure for each trench of the plurality of trenches.

3. The method according to claim 1, further comprising removing a portion of the sacrificial dielectric layer in each of the plurality of trenches to expose portions the substrate.

4. The method according to claim 3, wherein the removed portion of the sacrificial dielectric layer includes parts of the sacrificial dielectric layer under the spacers in each trench of the plurality of trenches, wherein an undercut region is formed under each spacer.

5. The method according to claim 4, further comprising forming a gate dielectric layer on the plurality of spacers, in the undercut region formed under each spacer and on the exposed portions of the substrate in each of the plurality of trenches, wherein the gate structure is formed on the gate dielectric layer in each of the plurality of trenches.

6. The method according to claim 1, further comprising:
   recessing the plurality of spacers and the gate structure in each of the plurality of trenches; and
   forming a dielectric cap layer on each of the recessed spacers and each gate structure.

7. The method according to claim 1, further comprising:
depositing a co-polymer in each of the plurality of trenches; and
annealing the co-polymer in each of the plurality of trenches to separate each co-polymer into a first polymer layer positioned between second polymer layers on opposite lateral sides of the first polymer layer.

8. The method according to claim 7, further comprising selectively removing the second polymer layers from each of the plurality of trenches.

9. The method according to claim 8, wherein forming the plurality of spacers comprises depositing spacer material into spaces in each of the plurality of trenches left by the selective removal of the second polymer layers.

10. The method according to claim 9, further comprising selectively removing the first polymer layer from each of the plurality of trenches.

11. The method according to claim 1, further comprising:
depositing a dummy spacer layer on the sidewalls and on the sacrificial dielectric layer in each of the plurality of trenches; and
depositing a dielectric layer on the dummy spacer layer in each of the plurality of trenches.

12. The method according to claim 11, further comprising recessing the dielectric layer on the dummy spacer layer in each of the plurality of trenches.

13. The method according to claim 12, further comprising removing exposed portions of the dummy spacer layer from each of the plurality of trenches.

14. The method according to claim 13, wherein forming the plurality of spacers comprises depositing spacer material in spaces in each of the plurality of trenches left by the removal of the exposed portions of the dummy spacer layer.

15. The method according to claim 14, wherein a resulting thickness of the deposited spacer material with respect to the sidewalls varies in each of the plurality of trenches.

16. The method according to claim 15, wherein the resulting thickness of the deposited spacer material is greater near the recessed dielectric layer on the dummy spacer layer than at portions above the recessed dielectric layer in each of the plurality of trenches.

17. The method according to claim 1, wherein a width of the gate structure varies in each of the plurality of trenches.

18. A semiconductor device, comprising:
a plurality of gate structures spaced apart from each other on a substrate;
a plurality of source/drain regions adjacent the plurality of gate structures;
a plurality of spacers on sidewalls of each of the plurality of gate structures, wherein the plurality of spacers comprise at least one of a low-k material and an airgap; and
a gate dielectric layer formed between each of the plurality of spacers and a corresponding gate structure, wherein the gate dielectric layer is further formed in an undercut region under each of the plurality of spacers, and on the substrate between the substrate and the corresponding gate structure.

19. The semiconductor device according to claim 18, wherein a width of each of the plurality of gate structures is greater in an upper portion of each gate structure than in a lower portion of each gate structure closer to the substrate.

* * * * *